United States Patent [19]

Osato

[11] Patent Number: 5,142,491

[45] Date of Patent: Aug. 25, 1992

[54] MAGNETIC BUBBLE RECORDING DEVICE

[75] Inventor: Yoichi Osato, Yokohama, Japan

[73] Assignee: Canon Kabushiki Kaisha, Tokyo, Japan

[21] Appl. No.: 798,053

[22] Filed: Nov. 27, 1991

Related U.S. Application Data

[63] Continuation of Ser. No. 305,192, Feb. 2, 1989, abandoned.

[30] Foreign Application Priority Data

Feb. 4, 1988 [JP] Japan .................. 63-22874
Mar. 18, 1988 [JP] Japan .................. 63-65299
May 12, 1988 [JP] Japan .................. 63-113666

[51] Int. Cl.$^5$ .................................. G11C 11/14
[52] U.S. Cl. .............................. 365/10; 365/27; 365/37
[58] Field of Search ............... 365/10, 27, 28, 29, 365/37, 39

[56] References Cited

U.S. PATENT DOCUMENTS

| 3,699,547 | 10/1972 | Owens et al. | 365/37 |
|---|---|---|---|
| 3,714,640 | 1/1973 | Bobeck | 365/27 |
| 3,901,770 | 8/1975 | Littwin | 204/15 |
| 3,968,481 | 7/1976 | Grundy et al. | 365/27 |
| 4,110,838 | 8/1978 | Noe | 365/2 |
| 4,125,876 | 11/1978 | Dimyan | 365/3 |
| 4,283,775 | 8/1981 | Cohen | 365/37 |
| 4,369,209 | 1/1983 | Iwashimizu et al. | 427/123 |
| 4,624,858 | 11/1986 | Capra et al. | 427/38 |
| 4,664,977 | 5/1987 | Osato et al. | 428/336 |
| 4,675,767 | 6/1987 | Osato et al. | 360/131 |

FOREIGN PATENT DOCUMENTS

| 0076184 | 4/1983 | European Pat. Off. |
| 2807836 | 9/1978 | Fed. Rep. of Germany |
| 2030802 | 4/1980 | United Kingdom |
| 2111775 | 7/1983 | United Kingdom |

OTHER PUBLICATIONS

IEEE Transactions on Magnetics, vol. Mag-11, No. 5, "Temperature Stable Self-Biasing Bubbles in Double layer Films", Sep. 1975, pp. 1078-1081.

IBM Tech. Dis. Bol., vol. 18, No. 8, "Magnetic Ink Bubble Access Technique", Jan. 1976, Deluca, pp. 2673-2674.

M. S. Cohen, "Contiguous Bubble Domain Propagation Structures", IBM Technical Disclosure Bulletin, vol. 18, No. 9, Feb. 1976, pp. 3082-3084.

Primary Examiner—Joseph A. Popek
Attorney, Agent, or Firm—Fitzpatrick, Cella, Harper & Scinto

[57] ABSTRACT

Disclosed is an improved magnetic bubble recording device for optically effecting writing, reading and erasure of information with respect to magnetic bubbles. The magnetic bubble recording device has a basic structure in which a first magnetic film for forming a magnetic bubble therein and a second magnetic film for imparting a bias magnetic field to the first magnetic film to stably hold the maganetic bubble in the first magnetic film are provided on a substrate on which is formed a transfer pattern for transferring a magnetic bubble along the transfer pattern, thereby providing a portable magnetic bubble recording device at low cost and with a simple structure. In addition, an alignment pattern for aligning the device with a light beam applied to the device is formed on the device, thereby permitting accurate writing and reading. The peripheral edge portion of the pattern of a transfer channel has a surface inclined with respect to the substrate surface so as to transfer the magnetic bubble favorably. Further, a device is provided in which a first transfer channel includes a plurality of transfer channels that do not intersect each other and a second transfer channel that intersects the transfer channels constituting the first transfer channel, formed so as to effect optical reading and writing smoothly and at high speed.

20 Claims, 12 Drawing Sheets

FIG. IA
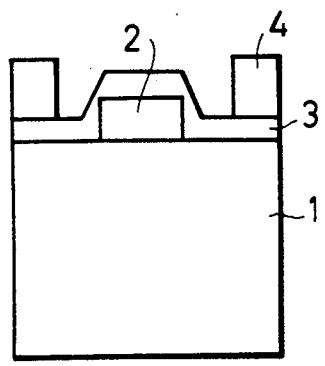
FIG. IB
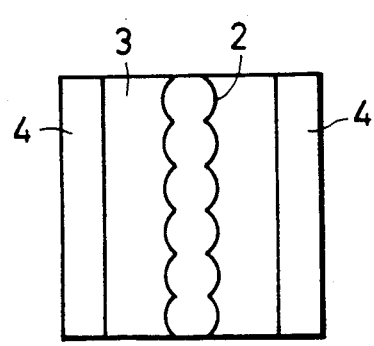
FIG. 2A
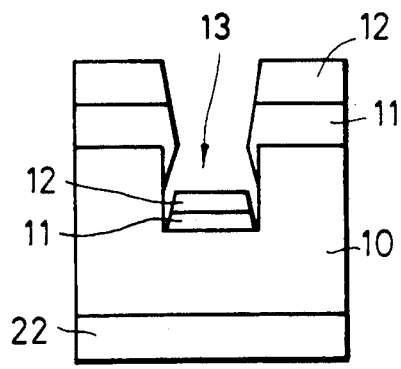
FIG. 2B
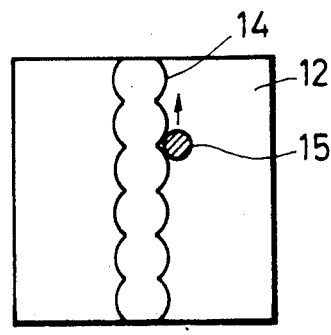
FIG. 3
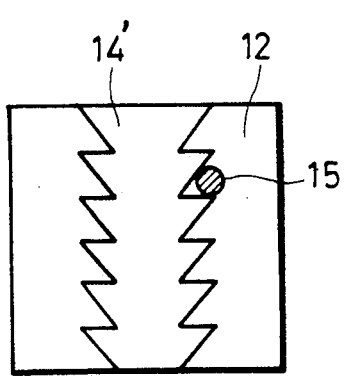
FIG. 4
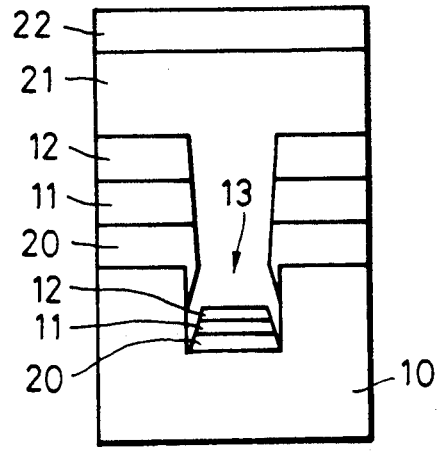

FIG. 25A
FIG. 25B
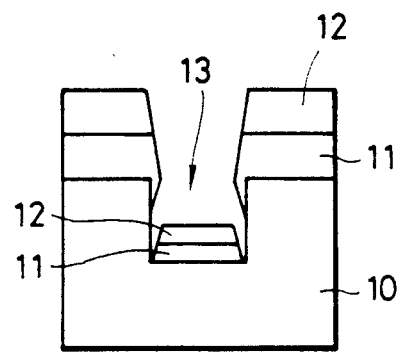
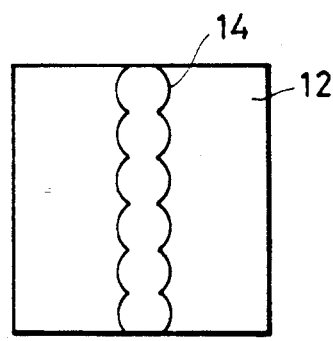
FIG. 26
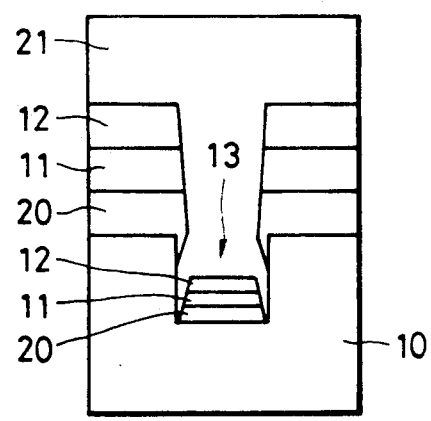

MAGNETIC BUBBLE RECORDING DEVICE

This application is a continuation of application Ser. No. 07/305,192 filed Feb. 2, 1989, now abandoned.

BACKGROUND OF THE INVENTION

1. Field of the Invention

The present invention relates to a magnetic bubble recording device, and more particularly to a magnetic bubble recording device in which writing, reading and erasure are carried out optically with respect to magnetic bubbles.

2. Description of the Prior Art

Development of magnetic bubble recording devices has proceeded in conjunction with that of semiconductor recording devices. Since magnetic bubble recording devices are characterized in having nonvolatile memories and in that they can operate in a stable manner at high temperatures, their use as memories has been increasing.

An example of the configuration of a conventional magnetic bubble recording device is shown in FIGS. 1A and 1B. FIG. 1A is a cross-sectional view thereof, while FIG. 1B is a top plan view thereof.

The conventional magnetic bubble recording device shown in FIGS. 1A and 1B comprises the following components: a garnet substrate 1 where magnetic bubbles are formed; a soft magnetic layer 2 adapted to transfer magnetic bubbles and formed of permalloy or the like; an insulating spacer layer 3; and a conductive film (wiring pattern or the like) 4 for generating a bubble transferring magnetic field or for receiving or transmitting various types of signals at the time of the recording and reproduction of information.

To transfer a magnetic bubble in a conventional magnetic bubble recording device, the soft magnetic layer 2 is magnetized in the direction of a rotating magnetic field, the latter rotating in the direction of a given plane (parallel with the surface of the substrate 1) and being produced by supplying an electric current to, for instance, a coil placed outside the magnetic bubble recording device or the conductive film 4 shown in FIG. 1B. The magnetic bubble held on the garnet substrate 1 in FIG. 1A is attracted and transferred to a bubble trapping point (a point where magnetization occurs) which is produced and displaced along the peripheral edge of a pattern of the soft magnetic layer 2.

In addition, the formation of a magnetic bubble is carried out by, for instance, allowing an electric current to flow to the conductive film 4 located adjacent to a specific point of the pattern of the soft magnetic layer 2 and by applying a local vertical magnetic field produced thereby to the garnet substrate 1. In addition, the detection of the presence or absence of the magnetic bubble is carried out by a detector (magnetic sensor) such as a Hall element disposed midway in the pattern of the soft magnetic layer 2.

With such a conventional magnetic bubble recording device, however, it is necessary to effect fine processing when providing a wiring pattern of signal lines for writing and reading on the chip as well as installing a magnet, a coil, etc., for producing the bias magnetic field. As a result, it has been difficult to provide a compact, lightweight recording device at low cost.

To overcome the above-described problems, the assignee of the invention has earlier proposed a method of optical writing using a magnetic bubble and a method of optical reading using the same in U.S. patent application Ser. Nos. 801,401 and 883,921. If these methods are used, the patterning provided for writing on the chip or reading therefrom does not need to be complicated.

SUMMARY OF THE INVENTION

Accordingly, an object of the present invention is to provide an improved magnetic bubble recording device suitable for conducting writing and reading with magnetic bubbles by using the above-described optical methods.

Another object of the present invention is to provide an inexpensive, compact and lightweight magnetic bubble recording device which can be used as a portable optical card.

To these ends, the magnetic bubble recording device in accordance with the present invention has a basic structure in which a magnetic layer for forming a magnetic bubble therein is provided on a substrate having a pattern of a transfer passage formed to transfer the magnetic bubble along the transfer pattern. Upon application of a light beam to this magnetic layer, it is possible to produce a magnetic bubble in the magnetic layer; upon application of a light beam to the magnetic bubble formed in the magnetic layer, it is possible to cause the magnetic bubble to disappear; and upon application of a light beam to the magnetic bubble formed in the magnetic layer and by detecting light passing therethrough and reflected therefrom by means of a photodetector, it is possible to detect (read) the magnetic bubble. In addition, the magnetic bubble carried in the magnetic layer moves along the pattern of the transfer passage as a predetermined magnetic field is caused to act thereon from the outside.

In accordance with a preferred form of the present invention, in addition to the above-described basic structure, a magnetic layer for applying a bias magnetic field to the magnetic bubble-forming magnetic layer is provided on the substrate. By virtue of this magnetic layer, a magnet conventionally provided to apply a bias magnetic field to the magnetic bubble recording device has become unnecessary.

In addition, in accordance with one aspect of the present invention, the magnetic bubble recording device is characterized in that a first magnetic layer for forming a magnetic bubble and a second magnetic layer for imparting a bias magnetic field to the first magnetic layer to stably hold the magnetic bubble within the first magnetic layer are provided on a substrate on which is formed a pattern constituting a magnetic bubble transfer passage, and an alignment pattern is further provided to align the substrate with a light beam for forming the magnetic bubble at a predetermined position of the first magnetic layer. In addition, as a modification of the magnetic bubble recording device in this aspect of the invention, there is provided a magnetic bubble recording device characterized in that a first magnetic layer for forming a magnetic bubble and a second magnetic layer for imparting a bias magnetic field to the first magnetic layer to stably hold the magnetic bubble are provided on a substrate on which is formed a pattern constituting a magnetic bubble transfer passage, and an alignment pattern is further provided to align the substrate with a light beam for extinguishing the magnetic bubble at a predetermined position of the first magnetic layer. Furthermore, there is provided a magnetic bubble recording device characterized in that a first magnetic layer for forming a magnetic bubble and a second magnetic layer for imparting a bias magnetic field to the first magnetic layer to stably hold the magnetic bubble are provided on a substrate on which is formed a pattern constituting a magnetic bubble transfer passage, and an alignment pattern is further provided to align the substrate with a light beam for determining the presence or absence of the magnetic bubble at a predetermined position of the first magnetic layer.

In accordance with another aspect of the invention, there is provided a magnetic bubble recording device characterized in that a first magnetic layer for forming a magnetic bubble and a second magnetic layer for imparting a bias magnetic field to the first magnetic layer to stably hold the magnetic bubble ar provided on a substrate on which is formed a pattern constituting a magnetic bubble transfer passage, the peripheral edge portion (side surface) of the transfer pattern being inclined by 20 to 80 degrees with respect to the substrate surface. This arrangement makes it possible to transfer a magnetic bubble very favorably.

The first and second magnetic layers in the magnetic bubble recording device in accordance with the present invention, if subjected to what is herein termed "exchange coupling," respectively excel in magnetic stability and sufficiently demonstrate their functions. The state of "exchange coupling" referred to herein means a state in which the magnetizations of the respective magnetic layers act in such a manner as to be oriented parallel or anti-parallel with each other.

In accordance with still another aspect of the invention, there is provided a magnetic bubble recording device characterized in that a first magnetic layer for forming a magnetic bubble and a second magnetic layer for imparting a bias magnetic field to the first magnetic layer to stably hold the magnetic bubble are provided on a substrate on which are formed a plurality of patterns constituting magnetic bubble transfer passages, and that the plurality of transfer passages include first transfer passages constituted by a plurality of transfer passages that do not intersect each other and a second transfer passage that intersects the respective transfer passages of the first transfer passages.

The above and other objects, features and advantages of the present invention will become more apparent from the following detailed description of the invention when read in conjunction with the accompanying drawings.

BRIEF DESCRIPTION OF THE DRAWINGS

FIGS. 1A 1B are diagrams illustrating an example of a conventional magnetic bubble recording device;

FIGS. 2A and 2B illustrate an embodiment of a magnetic bubble recording device in accordance with the present invention, in which FIG. 2A is a cross-sectional view, and FIG. 2B is a top plan view;

FIG. 3 is a top plan view illustrating a modification of the pattern of a transfer passage shown in FIG. 2B;

FIG. 4 is a cross-sectional view illustrating another embodiment of a magnetic bubble recording device in accordance with the present invention;

FIGS. 11A and 11B are diagrams illustrating still another embodiment of a magnetic bubble recording device in accordance with the present invention, in which FIG. 11A is a cross-sectional view, and FIG. 11B is a top plan view;

DESCRIPTION OF THE PREFERRED EMBODIMENTS

Figure 5:
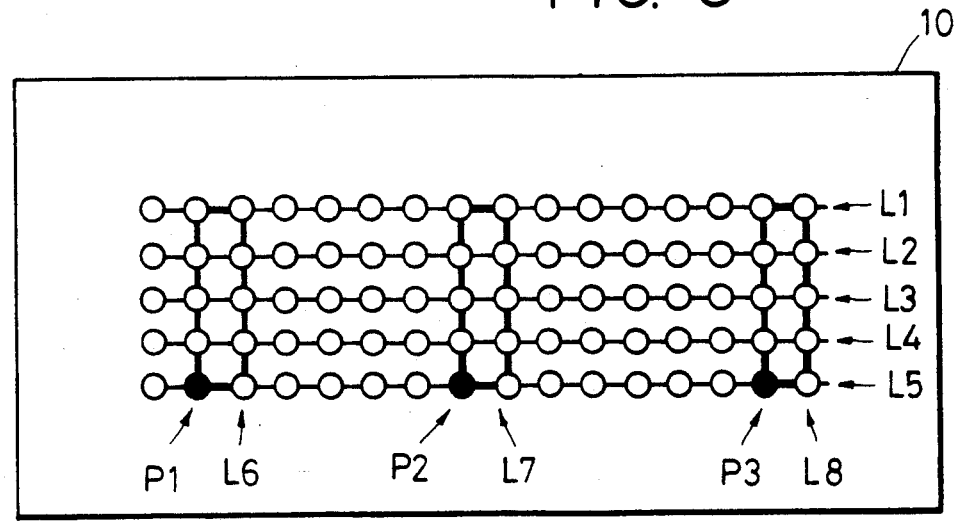
FIG. 5 an enlarged top plan view illustrating the pattern of a transfer passage and a light beam application region.

A detailed description will now be given of embodiments of a magnetic bubble recording device in accordance with the present invention.

The magnetic bubble recording device of the present invention is a portable recording medium, and various types of configuration can be adopted. However, since the type which is likely to be used most extensively is considered to ba a card-shaped one, the description given below cites by way of example a magnetic bubble card in which magnetic bubbles are used as carriers of information.

First, the basic configuration of a magnetic bubble card will be described. FIG. 2A is a cross-sectional view illustrating the configuration of a magnetic bubble card in accordance with the present invention, while FIG. 2B is a top plan view thereof.

In FIG. 2A, reference numeral 10 denotes a substrate having a magnetic bubble transfer passage 13 consisting of a concave pattern. The material constituting the substrate 10 is a metal, a semiconductor, various types of dielectric inorganic material, plastics, or the like. Various methods are available for forming the pattern of the transfer passage 13 on the substrate 10. For instance, it is possible to use a method in which etching is performed after coating a resist on a tabular substrate, as adopted in processes for manufacturing semiconductor devices, or a method in which a plastic sheet is formed onto which a pattern is transferred by etching or machining or by using a metal plate (stamper) having a pattern formed thereon by the aforementioned etching or machining.

Returning to FIG. 2A, a magnetic film (first magnetic layer) is used to form magnetic bubbles. A crystalline film formed of ferrite or garnet or an alloy film formed of a rare earth metal and a transition metal is used as the material of the magnetic film 11. Sputtering, vacuum heating evaporation, chemical vapor deposition (CVD) or the like is used to form this magnetic film 11.

Another magnetic film (second magnetic layer) 12 is used to impart a bias magnetic field to the magnetic film 11 which forms magnetic bubbles formed on the magnetic film acting to hold the magnetic bubbles formed on the magnetic film 11 in a stable state. The constituent material of this magnetic film 12 and the method of forming it can be selected in the same way as the magnetic-bubble forming magnetic film 11. In order to obtain a bias magnetic field that will hold magnetic bubbles stably while being transferred along the transfer passage 13, the compositions of the materials of the two films 11 and 12 are selected in such a manner that the magnitude of the magnetic field applied to the magnetic film 12 for imparting a bias magnetic field, in which inversion of magnetization occurs in a direction perpendicular to the surface of that film 12, is greater than that of the magnetic field applied to the magnetic film 11 when the magnetization in a direction perpendicular to the surface of the magnetic film 11 is saturated. A discrimination pattern 22 (alignment pattern) is provided so that the reflectance of a region for forming and detecting magnetic bubbles in this magnetic bubble card is different from other regions. The discrimination pattern 22 may alternatively be formed on the magnetic film 12 which imparts a bias magnetic field.

A magnetic bubble 15 moves vertically, as viewed in FIG. 2B, along a peripheral edge portion of the transfer passage pattern 14 when a magnetic bubble trapping point produced at the peripheral edge portion of the transfer passage pattern 14 (i.e., the portion where the magnetic films 11, 12 become discontinuous due to the uneven surface of the substrate) moves owing to a rotating magnetic field produced by an exteriorly placed coil which acts in the direction of surface of the substrate 10.

FIG. 3 is a top plan view illustrating a transfer passage pattern 14' which is a modification of the transfer passage pattern 14 shown in FIG. 2B. The transfer of the magnetic bubble 15 is effected by making use of a phenomenon whereby the diameter of the bubble expands or shrinks by virtue of a vibratory magnetic field acting in a direction perpendicular to the substrate surface which is produced by the exteriorly placed coil. At this juncture, the magnetic bubble moves vertically, as viewed in FIG. 3, along the bubble trapping point of the transfer passage pattern 14' which has a vertically asymmetrical configuration.

FIG. 4 is a cross-sectional view illustrating a modification of the magnetic bubble recording device shown in FIG. 2A. In FIG. 4, members which are the same as those shown in FIG 2A are denoted by the same reference numerals. A soft magnetic film 20 is used in increase the magnetic charge of the bubble trapping point of the transfer passage pattern, and a protective film 21 is designed to improve the weather resistance and durability of the magnetic films 11, 12 and 20. As the material of the protective layer 21, it is possible to use an inorganic material such as oxides, nitrides and carbides, a metallic material, or a high polymer material which hardens by application of light or heat thereto. I should be noted that, in FIG. 4, the position of the magnetic film 12 for imparting a bias magnetic field and the position of the soft magnetic film 20 may be switched. Additionally, each of the magnetic films 11, 12 and 20 may be provided with a protective layer 21, and the arrangement of the magnetic films 11 and 12 may be reversed. Numeral 22 denotes a discrimination pattern similar to the one provided for the device shown in FIG. 2A. In this embodiment as well, it is possible to provide the discrimination pattern 22 on the reverse side of the substrate 10.

FIG. 5 is an enlarged view of the transfer passage patterns provided on the substrate 10 of this magnetic bubble card. In the drawing, reference characters L1 to L5 respectively denote a series of transfer passage patterns (first transfer passages) which do not intersect each other. Meanwhile, reference characters L6 to L8 respectively denote transfer passage patterns (second transfer passages) in the form of closed loops which cross all the juxtaposed transfer passage patterns L1 to L5. Points P1 to P3 are positions at which light beams from an optical head are applied for recording, reproduction and erasure of information. Incidentally, the term "optical head" is an abbreviation for an optical information recording and reproducing apparatus of the type described later.

Figure 6:
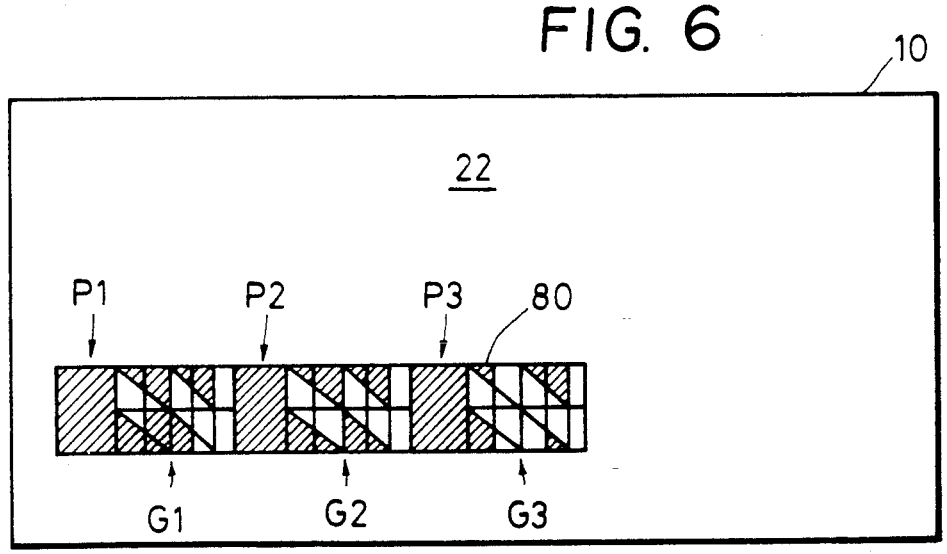
FIG. 6 is an enlarged top plan view illustrating an alignment pattern.

FIG. 6 shows the substrate 10 of the magnetic bubble card, as viewed from the side thereof (e.g., the side of the discrimination pattern 22 in FIG. 2A) to which light beams are applied, alignment patterns P, G being depicted in FIG. 6. P1 to P3 respectively denote target portions to which light beams are applied for recording, reproduction and erasure, and these target portions respectively correspond to the positions of P1 and P3 on a transfer passage shown in FIG. 5. G1 to G3 respectively denote guide portions for aligning light beams emitted from the respective optical heads with the respective irradiation positions P1-P3. To discriminate the irradiation positions, an arrangement may be provided in such a manner that the reflectances of the adjacent guide portions G1 to G3 differ. The regions 80 (the hatched and blank portions in the drawing) thus formed will be referred to as specific reflectance areas. Preferably, discrimination can be facilitated if the guide portions G1-G3 are formed by elements having two or more different kinds of reflectances and their area ratios are varied so that the reflectances of the guide portions G1-G3 vary continuously or cyclically.

Figure 7:
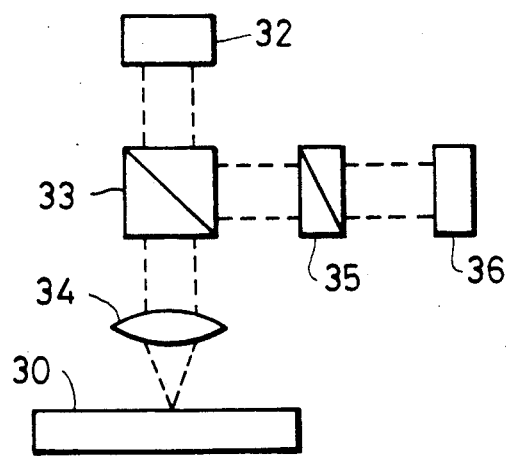
FIG. 7 is a schematic diagram illustrating an example of an optical information recording and reproducing apparatus for recording, reproducing and erasing information using the present magnetic bubble recording device.

FIG. 7 shows a basic conceptual drawing of an optical information recording and reproducing apparatus for effecting the recording, reproduction and erasure of information with respect to the above-described magnetic bubble card. In the drawing, the optical information recording and reproducing apparatus comprises a light source 32 such as a semiconductor laser or the like, a polarizing beam splitter 33, an objective lens 34 for condensing a light beam, a magnetic bubble card 30 in accordance with the present invention, a photodetector 35, and an optical sensor 36.

A beam emitted form the semiconductor laser 32 passes through the polarizing beam splitter 33 and the objective leans 34, and is condensed into the aforementioned point P1 on the magnetic bubble card 30. The laser beam reflected by the magnetic bubble card 30 passes through the objective lens 34, the polarizing beam splitter 33 and the photodetector 35 and then reaches the optical sensor 36.

The formation of a magnetic bubble is effected by increasing the output of the semiconductor laser 32 to increase the temperature of the light beam at a focal point on the magnetic bubble card 30, thereby reversing the magnetization of the magnetic film 11. In addition, a magnetic field for aiding reversal of magnetization may be applied to the magnetic bubble card 30, as necessary.

The opto-magnetic effect is utilized in the detection of a magnetic bubble. In other words, as regards the laser beam reflected by a magnetic bubble detection area, i.e., at the point P1, the direction of rotation of a polarizing plane differs depending on the orientation of the magnetization of the magnetic bubble, so that the installation angle of the photodetector 35 is set, as required, to discriminate between the presence and absence of a magnetic bubble by making use of the phenomenon in which the amount of reflected laser beam made incident upon the photosensor 36 varies depending on the presence or absence of a magnetic bubble. As a result, it is possible to ascertain the contents of the information at points P1 to P3.

Figure 8:
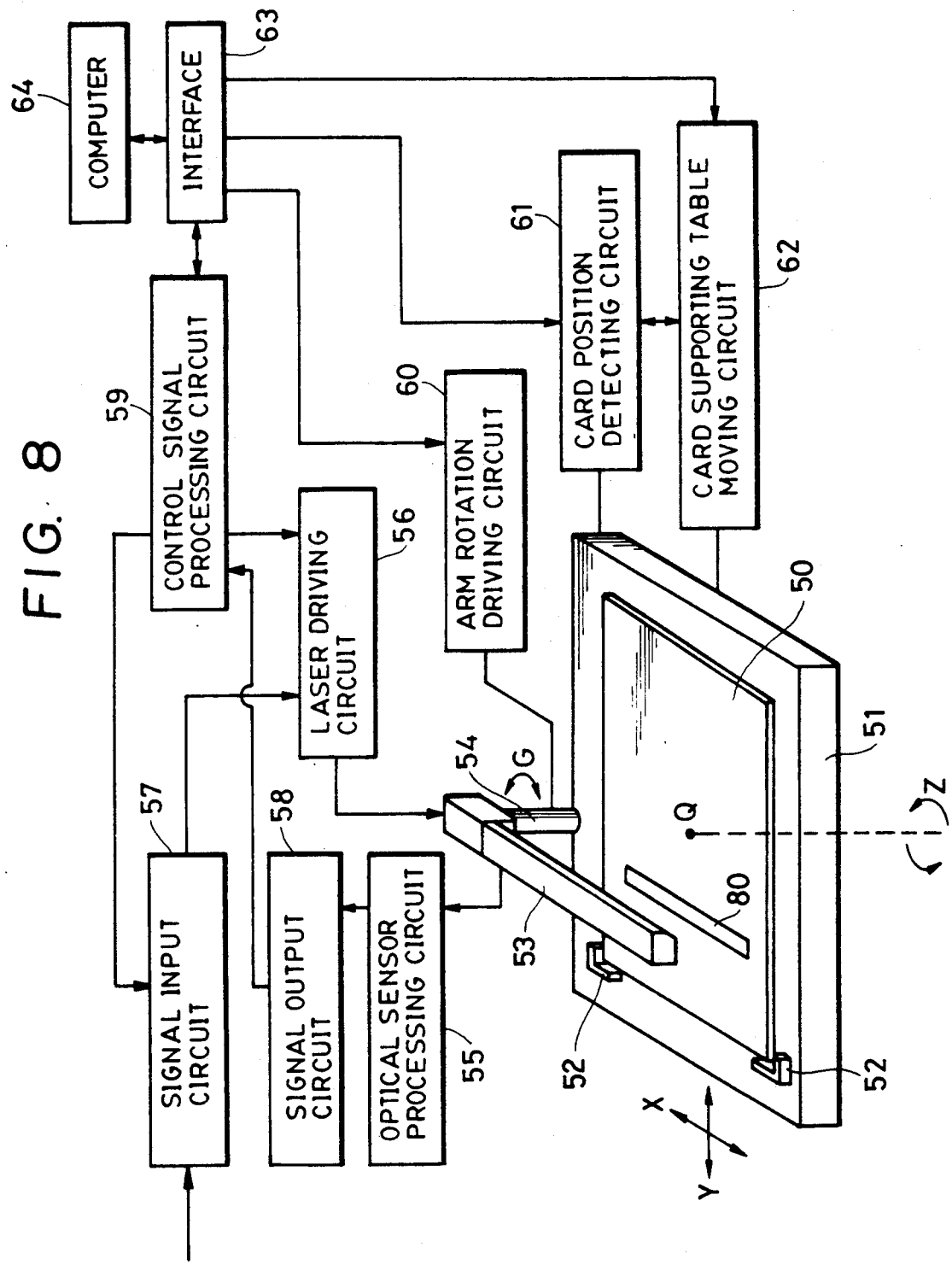
FIG. 8 is a schematic diagram illustrating a data input/output system for writing magnetic bubbles in the magnetic bubble recording device shown in FIGS. 2A and 2B or 4, for erasing the magnetic bubbles of the device, and for reading the magnetic bubbles of the device.

An embodiment of the optical information recording and reproducing apparatus for the magnetic bubble card shown in FIGS. 2A and 2B or FIG. 4 is shown in FIG. 8 as a data input/output apparatus. A description will be given of the operation and the like of alignment between the specific reflectance area 80 of the alignment pattern and the optical head when an input or output of data of the magnetic bubble card is effected in accordance with this embodiment.

FIG. 8 is, in part, a schematic block diagram of the data input/output apparatus. In the drawing, reference numeral 50 denotes the magnetic bubble card in accordance with the present invention; 80, a specific reflectance area which is an alignment pattern formed thereon; and 51, a card support table, which can be driven by a driving mechanism (not shown) in the X- and Y-directions in the drawing and can be rotated by a rotating mechanism (not shown) in the direction indicated by arrows Z with a point Q as a center, as necessary. Numeral 52 denotes claws (stoppers) for fixing the position of the card 50 when the card 50 is inserted from the righthand side, as viewed in the drawing. Numeral 53 denotes an optical head integrally incorporating a plurality of the optical information recording and reproducing apparatus shown in FIG. 7. This optical head 53 is rotated in the direction indicated by arrows G in the drawing by an arm 54 which is a rotatable column. Numeral 57 is a signal input circuit, and its signal is sent to a laser driving circuit 56 to drive a plurality of semiconductor lasers in the optical head 53. Numeral 55 denotes an optical sensor processing circuit for processing a signal of the optical sensor for receiving reflected laser beams when the laser beams from the semiconductor lasers are applied to the magnetic bubble detection area and the specific reflectance area 80. A signal from the circuit 55 is transmitted to an interface 63 via a signal output circuit 58 and a control signal processing circuit 59. A computer 64 sends commands to the control signal processing circuit 59, an arm rotation driving circuit 60, a card position detecting circuit 61, and a card support table moving circuit 62 via the interface 63.

A description will now be given of the operation of the apparatus shown in FIG. 8.

First, the magnetic bubble card 50 is inserted into the data input/output apparatus shown in FIG. 8, and the magnetic bubble card 50 is conveyed by a conveying mechanism (not shown) up to the position of the claws 52 for stopping the magnetic bubble card 50. Since the apparatus is arranged such that the position of the specific reflectance area 80 is substantially aligned with the position of the optical head 53 in that state, if each of the semiconductor lasers of the optical head 53 is driven, a light beam reflected from the specific reflectance area 80 is made incident upon the sensors of most of the optical information recording and reproducing apparatus (the sensors respectively corresponding to the information processing positions P1-Pn of the magnetic bubble card). Then, the support table 51 of the magnetic bubble card 50 and/or the arm 54 supporting the optical head is rotated in such a manner that the directions in which the specific reflectance area 80 and the optical information recording and reproducing apparatus are arranged become identical (i.e., in such a manner that the number of the sensors which receive the light beams reflected from the specific reflectance areas 80 becomes greater).

Subsequently, while the laser beams reflected from the guide portions (G1-G3 in FIG. 6) of the specific reflectance areas 80 are being monitored by the sensors, the support table 51 of the magnetic bubble card 50 is moved in the X- and Y-directions, thereby effecting the positioning of the beam irradiation positions (the target portions P1-P3) of the alignment pattern of the magnetic bubble card 50 relative to the optical head 53. In other words, alignment of the target portions P1-P3 with the laser beams is carried out.

Thus, positioning can be performed accurately if the positioning of the magnetic bubble card 50 relative to the optical head 53 is effected after the skew of the magnetic bubble card 50 and the optical head 53 is adjusted.

Figure 9:
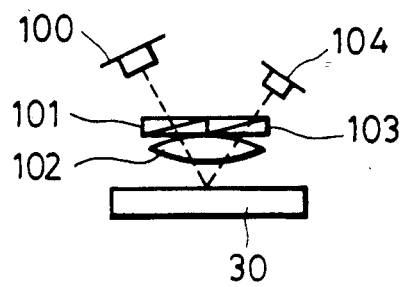
FIGS. 9 and 10 are schematic diagrams illustrating modifications of the optical information recording and reproducing apparatus shown in FIG. 7.

FIG. 9 is a diagram illustrating another example of the configuration of the optical head. Unlike the embodiment shown in FIG. 7 in which the laser beams are made incident perpendicularly upon the substrate surface of the magnetic bubble card, FIG. 9 shows a case in which the laser beams are made diagonally incident thereupon. In the drawing, the optical head comprises a one-unit semiconductor laser 100 of an optical information recording and reproducing apparatus, polarizing plates 101 and 103, an objective lens 102, and a light receiving element 104.

Figure 10:
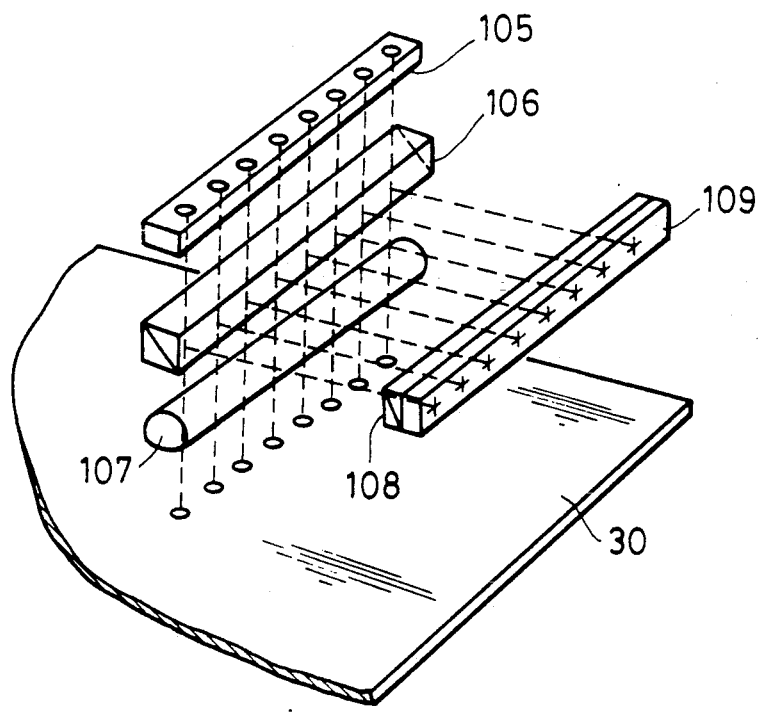

FIG. 10 is a diagram illustrating the manner in which all the elements (a semiconductor laser 105, a polarizing plate 108, a lens 107, a light receiving element 109, a polarizing beam splitter 106, and the like) are arranged in the form of arrays. These elements are positioned with a resin that allows laser beams to be transmitted therethrough, and are secured integrally thereby. In FIG. 10, the optical paths indicated by broken lines constitute the optical paths of the laser beams.

A description will now be given of a method of recording, erasing or reproducing information using the data input/output system shown in FIG. 8.

At the time of recording, the bit train of the magnetic bubbles is driven horizontally, as viewed in the drawing, along the transfer passages L1–L5 formed in the magnetic bubble card 50 and shown in FIG. 5, by imparting a rotating magnetic field in the inward direction of the substrate surface at a given angular speed. At this time, the address recorded in L5 among the bit strings being transferred is monitored at the points P1–P3 by the optical head 53 having a function equivalent to that of the optical information recording and reproducing apparatus shown in FIG. 7 (in this embodiment, it is assumed that, when data is input to a bit string in the process of forming magnetic bubbles, an address is recorded in L5 for each bit string (data)). When magnetic bubbles have entered a bit train of a desired address, the magnetic bubbles are transferred vertically, as viewed in FIG. 5, along the transfer passages L6–L8 in the form of loops in which this bit string is closed consecutively. To transfer magnetic bubbles in the two directions, it is important to design the configuration of the transfer pattern and the driving magnetic field. Subsequently, laser beams modulated by the input signal of data are applied to the points P1–P3 by the optical information recording and reproducing apparatus corresponding those positions, so as to increase the temperature of the magnetic bubble-forming magnetic film and to record in the magnetic bubble card 50 a bit string of magnetic bubbles corresponding to the data signal.

Erasure can also be effected on the basis of a processing concept similar to the one described above.

Reproduction is effected by the following processing.

First, bit strings of magnetic bubbles are transferred in the horizontal direction, as viewed in FIG. 5, along the transfer passages L1–L5 shown in FIG. 5. At that time, the address recorded in L5 among the bit strings being transferred is monitored at the points P1–P3 by the optical head 53. When magnetic bubbles have entered a bit train of a desired address, the magnetic bubbles are transferred vertically, as viewed in FIG. 5, along the transfer passages L6–L8 in the form of loops in which this bit string is closed consecutively. Then, the laser beams reflected from the bit strings and occurring as a result of irradiating the points P1–P3 with the laser beams are monitored by the optical sensor so as to obtain a reproduction signal.

A specific example of the configuration of the magnetic bubble card of the present invention will be illustrated below.

A protective film formed of $Si_3N_4$ and having a thickness of 1,200 Å was provided on a one mm-thick acrylic substrate provided with transfer passage pattern of about 15$\mu$ track pitches, as shown in FIG. 5, by means of sputtering. Then, a magnetic film formed of $Tb_{22}Fe_{70}Co_8$ (atomic ratio) and having a thickness of 3,000 Å was provided as a magnetic bubble-forming magnetic film. A magnetic film formed of $Tb_{10}Gd_{10}Fe_{80}$ (atomic ratio) and having a thickness of 2,000 Å was then provided as a magnetic film layer. Then, a Si film with a thickness of 1,000 Å was provided as a protective layer. A $Fe_{70}Ni_{30}$ (atomic ratio) having a thickness of 5,000 Å was provided as a soft magnetic film for transferring magnetic bubbles.

Furthermore, a photo-setting acrylic resin was provided as a protective layer having a thickness of 15$\mu$ by means of the spinner application method.

Finally the pattern shown in FIG. 6 was transferred onto the rear side of the thus-formed sample acrylic substrate which is remote from the side provided with the magnetic films and the protective layers, by screen printing in such a manner that the specific reflectance regions 80 of the points P1–P3 are superposed on the points P1–P3 shown in FIG. 5 along the transfer passage L5 shown in FIG. 5. In this example, a black ink layer (absorbing laser beams with a wavelength of 830 mm from the semiconductor laser which is a light source) was transferred onto portions other than the hatched portions shown in FIG. 6.

The prepared magnetic bubble card was inserted into the data input/output system shown in FIG. 8. While the respective reproduction signals (the amount of light reflected from the surface of the magnetic bubble card) from the optical head 53 were being observed, the arm 54 provided with the optical head 53 was rotated so that the light reflected from the specific reflectance regions 80 of the alignment pattern would enter all the sensors. Then, the discrimination signals of the guide portions G of the alignment pattern were monitored using the sensors by moving the support table 51 of the magnetic bubble card. When a predetermined position (in this example, one in which the intensity of the laser beams reflected from, for instance, the guide portions G1–G3 becomes maximum) is determined, after completion of the alignment, a rotating field with a magnitude of 350 gauss was applied in the inward direction of the substrate surface of the magnetic bubble card so as to effect the transfer of magnetic bubbles along the transfer passages L1–L5 shown in FIG. 5. When the bit string reached the position of a predetermined address, the driving magnetic field was modulated, and the reproducing, recording, and erasing operations were carried out while the magnetic bubbles were being transferred toward the transfer passages L6–L8 show in FIG. 5.

As described above, the magnetic bubble recording device is arranged such that the first magnetic layer for forming magnetic bubbles and the second magnetic layer for imparting a bias magnetic field to the first magnetic layer to stably hold the magnetic bubbles are provided on a substrate in which a pattern of magnetic bubble transfer passages is formed. This magnetic bubble recording device has at least one specific portion in a part of the aforementioned transfer passage to effect at least one operation among the formation, erasure, and detection of a magnetic bubble through non-contact by means of an optical beam. In addition, the magnetic bubble recording device has a positioning discrimination pattern on the magnetic bubble device, allowing a predetermined means to discriminate the position of the specific portion.

In addition, the information recording and reproducing apparatus for this magnetic bubble recording device is adapted to effect inputting and outputting of data using the above-described magnetic bubble recording device, and is provided with at least one of the following means:

(i) means for detecting a region indicating a positioning discriminating pattern by moving the magnetic bubble recording device and/or the optical head by using the optical head for forming and detecting magnetic bubbles in the device;

(ii) means for making identical the directions in which the region indicating the positioning discrimination pattern and the optical head are arranged, by rotating the magnetic bubble recording device and/or the optical head from the state described in (i) above;

(iii) means for aligning the respective positioning discrimination patterns with the optical head by moving the magnetic bubble recording device and/or the optical head from the state described in (ii) above while the regions of the positioning discriminating patterns are being monitored by the sensors; and (iv) means for manually moving the magnetic bubble recording device and/or the optical head in the states described in (i)-(iii) above and means for instructing the direction in which the movement is to be effected.

In accordance with the magnetic bubble recording device, the following basic advantages can be derived:

(1) Transfer passage patterns are provided on a substrate in advance by various types of patterns (e.g., concave or convex patterns are formed on the substrate itself). Then a magnetic layer for forming bubbles is formed on the patterns, and those patterns are used as the transfer passages for the bubbles (a series of transfer passages and processing transfer passages). Accordingly, only one patterning need to be carried out during production, so that a recording medium can be provided at low production costs.

(2) Since the formation of magnetic bubbles in the magnetic bubble recording device (recording), the discrimination of the presence or absence of a magnetic bubble (reproduction), and erasing of the magnetic bubble (erasure) are effected through noncontact by using laser beams, in the same way as a opto-magnetic disk, complicated fine processing is not required, and the device itself can be produced at low costs.

(3) In addition, since a coil and the like for producing a magnetic field for transferring magnetic bubbles is installed on the recording and reproducing apparatus side, it is possible to provide a compact, lightweight magnetic bubble recording device (magnetic bubble recording medium).

In other words, in accordance with the present invention, the drawbacks of a conventional magnetic bubble device which has become complicated and large in size and weight since arrangements corresponding to the recording, erasure and reproduction of information are accommodated in one device are overcome by combining a recording medium in which consideration is primarily paid to the holding and transfer of magnetic bubbles on the one hand, and an optical method of effecting recording, reproduction and erasure with respect to that recording medium on the other (by separating the functions). As a result, it is possible to provide a novel and compact magnetic bubble recording device with excellent portability and an information processing system using the same.

In such a concept of the invention, processing of information with respect to the magnetic bubble recording device (recording, reproduction and erasure) is effected at a specified location of a magnetic bubble transfer passage, but, in order to improve the information processing speed, it is necessary to increase the number of such locations and to process a large volume of information at a time. However, to increase the number of such locations involves difficulty in the alignment between the recording device and the optical head of the recording and reproducing apparatus. The present invention provides a magnetic bubble recording device which is capable of coping with such problems and an information recording and reproducing apparatus for the magnetic bubble recording device.

In other words, this magnetic bubble recording device is arranged such that a positioning discrimination pattern is disposed in correspondence with the location of information processing with respect to magnetic bubbles, and the information recording and reproducing apparatus for the magnetic bubble recording device is provided with the aforementioned means ((i)-(iv) for effecting alignment between the magnetic bubble recording device and the optical head. Hence, the information of the magnetic bubble recording device can be processed accurately and at high speed.

Hereafter, a detailed description will be given of another embodiment of a magnetic bubble recording device.

In the following description, a magnetic bubble card will be cited by way of example in the same way as the above-described embodiment.

Figure 11A:
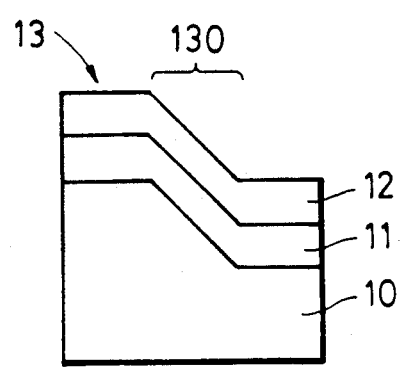
Figure 11B:
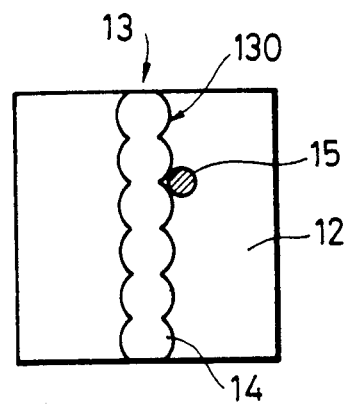

First a basic configuration of this magnetic bubble card will be described. FIG. 11A is a cross-sectional view illustrating the configuration of this magnetic bubble card, while FIG. 11B is a top plan view thereof.

In FIG. 11A, numeral 10 denotes a substrate. As the material of the substrate 10, a metal, a semiconductor, various inorganic materials that are dielectric, or a plastic is used. The substrate 10 is provided with a transfer passage 13, and a peripheral edge portion 130 which is a side surface thereof is inclined by 20 to 80 degrees with respect to the region where a magnetic bubble is formed.

A magnetic film (first magnetic layer) 11 is capable of forming a magnetic bubble. As its material, a crystalline film formed of ferrite or garnet or an alloy film of a rare earth metal and a transition metal is used. As for a method of forming the film, sputtering, vacuum deposition, or CVD is used.

A magnetic film (second magnetic layer) 12 imparts a bias magnetic field to the magnetic film 11 so as to stably hold the magnetic bubble formed on the magnetic film 11. Both the material of the film and the forming method can be selected in the same manner as the magnetic bubble-forming film 11. In order to obtain a bias magnetic field allowing a magnetic bubble to be held stably during transfer, the compositions of the materials of the magnetic films 11 and 12 are selected in such a manner that a magnetic field applied for reversal of magnetization of the magnetic film 12 is greater than the magnetic field applied for saturating magnetization of the magnetic bubble-forming magnetic film 11 in a direction perpendicular to the surface of the substrate 10.

In FIG. 11B, numeral 14 denotes a pattern of the magnetic bubble transfer passage.

Figure 12:
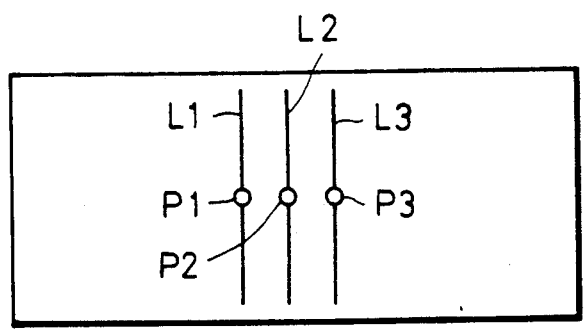
FIG. 12 is a diagram illustrating the layout of the pattern of a transfer passage in accordance with the embodiment shown in FIGS. 11A and 11B.

FIG. 12 is a conceptual diagram of the pattern of the transfer passage 13 of the magnetic bubble card in accordance with the present invention. In the drawing, reference characters L1-L3 denote a series of transfer passages which do not intersect each other. Points P1-P3 are locations to which light beams are applied by the aforementioned optical information recording and reproducing apparatus to effect recording, reproduction and erasure of information.

Figure 13:
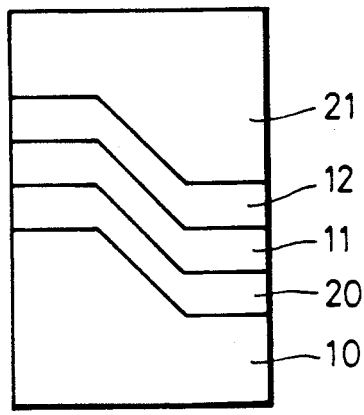
FIG. 13 is a diagram illustrating a further embodiment of a magnetic bubble recording device in accordance with the present invention.

FIG. 13 illustrates a modification of the magnetic bubble card shown in FIG. 11A.

In FIG. 13, a soft magnetic film 20 is formed of permalloy or the like and is adapted to increase the magnetic charge of the bubble trapping point of the transfer passage pattern (i.e., magnetization of the planar component of the substrate surface). A protective film 21 is provided to improve the weather resistance and durability of the magnetic films 11, 12 and 20. As the material of the protective layer 21, it is possible to use an inorganic material such as oxides, nitrides and carbides, a metallic material, or a high polymer material which hardens by application of light or heat thereto. The position of the magnetic film 12 and the position of the soft magnetic film 20 may be switched, and the soft magnetic film 20 need not be adjacent to the magnetic bubble-forming magnetic film 11.

To transfer a magnetic bubble in this magnetic bubble card, a magnetic bubble is moved along the peripheral edge portion of the transfer passage 13 when a bubble trapping point (a point where a magnetic charge occurs in the planar direction of the surface of the substrate 10), which is produced at the peripheral edge portion of the transfer passage 13 (i.e., a boundary portion between the region where a magnetic bubble is formed and the transfer passage 13; in this embodiment, an inclined surface 130 inclined by 20 to 80 degrees with respect to the substrate surface) by virtue of a rotating magnetic field acting in the planar direction of the substrate surface and produced by a coil disposed exteriorly. For instance, a magnetic bubble 15 moves vertically, as viewed in FIG. 11B.

In the case of a conventional magnetic bubble device, the transfer passage pattern is constituted by a soft magnetic layer magnetized parallel with its film surface, so that a strong bubble trapping point (i.e., a point where a large magnetic charge occurs in the inward direction of a given plane) occurs around a peripheral edge portion thereof.

On the other hand, the following reason accounts for the fact that a point of occurrence of strong magnetization in the inward direction of a given plane of the substrate is produced around the peripheral edge portion of the transfer passage 13 of the magnetic bubble card.

In FIG. 11A, since the compositions of the magnetic films 11 and 12 ar selected in such a manner that the direction of the axis of easy magnetization becomes perpendicular to the surface of the substrate 10 (the surfaces of the magnetic films), the magnetic films 11 and 12 are not readily magnetized in the inward direction of a given plane of the substrate.

However, with regard to the film accumulated on the peripheral edge portion of the transfer passage designated at 130 in the drawing, the direction in which an element of the magnetic material is made incident upon the substrate to be accumulated on the substrate by means of vacuum deposition or sputtering is diagonal although the direction of said incidence with respect to the other portions of the magnetic film is substantially vertical.

As a result, the film accumulated at the position of the transfer passage 130 is liable to be magnetized in both directions perpendicular and horizontal to the film surface, the magnetization being dependent on the angle at which the peripheral edge portion 130 is inclined with respect to the region where the magnetic bubble is formed (or the substrate surface).

Figure 14:
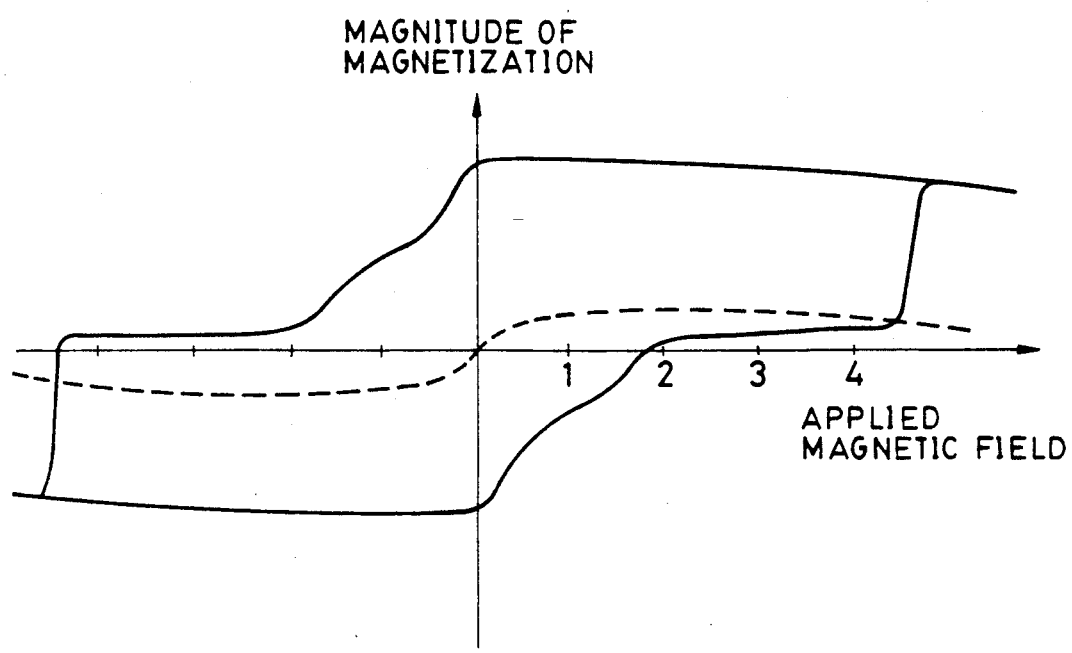
FIGS. 14 and 15 are graphs illustrating the relationship between the magnitude of an applied magnetic field and the magnitude of magnetization at a peripheral edge portion of the pattern of a transfer passage in this magnetic bubble recording device.

FIG. 14 illustrates curves (hereafter referred to as B-H curves) showing the relationship between the magnetic flu density (B) and the magnetic field (H) of a sample in which the films were formed of magnetic material elements by setting the substrate 10 parallel with a target surface (i.e., in such a manner that the direction in which the magnetic material elements are made incident upon the substrate surface is substantially perpendicular to the substrate surface). The sample was arranged as follows: An 800 Å-thick $Si_3N_4$ film was provided on a 1-mm thick flat acrylic plate, a $Gd_{17}Fe_{83}$ film with a 2,000 Å thickness (corresponding to the bubble forming film) was then provided thereon, a $Tb_{22}Fe_{70}CO_8$ with a 3,500 Å thickness (corresponding to the film for imparting a bias magnetic field) was further provided thereon, and a $Si_3N_4$ film with a thickness of 1,000 Å was finally provided thereon.

In FIG. 14, the abscissas represent an applied magnetic field (KG), while the ordinates represent the magnitude of magnetization (arbitrary units).

The loop shown by the solid line is a case in which a magnetic field was applied vertically to the films of the sample. Specifically, the film which exhibits saturation in magnetization at about 1.8 KG is the magnetic bubble-forming magnetic film formed of GdFe, while the film exhibiting saturation in magnetization at about 4.7 KG is the magnetic film formed of TbFeCo for imparting a bias magnetic field. The loop shown by the broken line is a case in which a magnetic field was applied in a direction parallel with the films of the sample, and this graph shows that all the magnetic films were virtually not magnetized upon application of a magnetic field of about 6 KG. Namely, the films were magnetized vertically.

Figure 15:
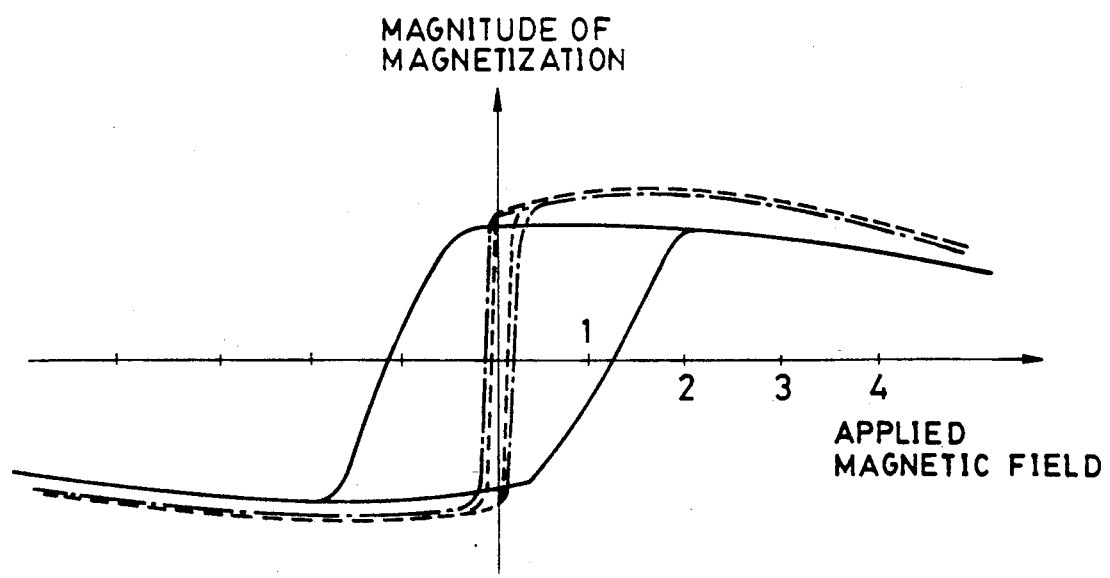

FIG. 15 shows B-H curves of a sample in which films were formed of magnetic material elements by setting the substrate to be inclined by 60 degrees with respect to the target surface. The configuration, thickness, composition, and the like of this sample were the same as those of the sample shown in FIG. 14.

The loop shown by the broken line illustrates a case in which a magnetic field was applied parallel with the direction of the film surface of the sample, and magnetization was saturated by the magnetic field of 50–200 G. In other words, the films are liable to be magnetized in the planar direction of the substrate surface. The loop shown by the solid line illustrates a case in which a magnetic field was applied vertically to the films of the sample, in which case magnetization is saturated at about 2 KG. In addition, the loop shown by the dash-dot line illustrates a case in which a magnetic field was applied to the films of the sample by inclining the magnetic field by 30 degrees from the direction horizontal to the films toward the vertical direction, in which case the results were substantially the same as the case shown by the broken line in which the magnetic field was applied in a horizontal direction.

From the results shown in FIGS. 14 and 15, if a magnetic bubble card is used in which the peripheral edge portion of the transfer pattern is inclined 60 degrees with respect to the substrate surface, it can be estimated that favorable transfer of bubbles is carried out by virtue of the planar magnetic field of tens to hundreds of G.

Then, a similar measurement of B-H curves was made by preparing a sample which was similar in terms of the configuration, thickness, composition and the like except that the angle of inclination of the substrate with respect to the target surface was varied. The results are shown in Table 1.

Although there is a tendency that the planarly magnetized component does not increase unless the set angle is increased in the case of a magnetic film having a greater coercive force, the planarly magnetized com-

TABLE 1

| Sample | Set Angle (degrees) | Applied Magnetic Field in Which Magnetization is Saturated in the Direction of the Film Surface (G) | Applied Magnetic Field in Which Magnetization is Saturated in the Direction Perpendicular to the Film Surface (G) | Applied Magnetic Field in Which Magnetization is Saturated in the Direction Parallel to Bubble-Forming Region (G) | Ratio of Accumulation Speed |
|---|---|---|---|---|---|
| 1 (FIG. 14) | 0 | 10,000 or more | 4,700 | 10,000 or more | 100 |
| 2 | 10 | 5,000 | 4,600 | 5,000 | 100 |
| 3 | 20 | 500–1,500 | 4,500 | 500–1,500 | 98 |
| 4 | 30 | 100–500 | 4,000 | 50–200 | 94 |
| 5 | 40 | 50–200 | 2,500 | 50–200 | 88 |
| 6 | 50 | 50–200 | 2,000 | 50–200 | 75 |
| 7 (FIG. 15) | 60 | 50–200 | 2,000 | 50–200 | 60 |
| 8 | 70 | 50–200 | 2,000 | 50–200 | 50 |
| 9 | 80 | 50–200 | 1,500 | 50–200 | 40 |

In Table 1, the row of Sample 1 with an angle set at 0 shows the measures results of the sample shown in FIG. 14, while the row of Sample 7 with the angle set at 60 degrees shows the measured results of the sample shown in FIG. 15.

From these results, it can be appreciated that, with an increase in the set angle (20 degrees or above), the planar component which is magnetized with a small magnetic field applied increases, thereby enabling transfer of bubbles (this is attributable to the fact that the planar magnetized component increases in the magnetic bubble-forming magnetic film constituted by a GdFe film). If the set angle exceeds 40 degrees, planar magnetization is saturated by a magnetic field of only 200 G or thereabout applied in the planar direction. This attributable to the fact that a planarly magnetized component also increases in the TbFeCo film for imparting a bias magnetic field, and the planarly magnetized components of the both the GdFe and TbFeCo magnetic films are powerfully combined, with the result that the magnetization of the TbFeCo film in the planar direction is saturated by even a small applied magnetic field.

In addition, when the angle is set to 80 degrees and 85 degrees in Table 1, the ratios in the accumulating speed as compared with 0 degree become 40/100 and 20/100, respectively. Accordingly, if the efficiency at the time of manufacturing magnetic bubble cards is taken into consideration, it is preferable not to increase the set angle higher than 80 degrees.

In addition, the coercive force of the GdFe film used in the samples shown in Table 1 was 50–200 G, the magnitude of its saturated magnetization was 300 emu/cc, the coercive force of the TbFeCo film was 3–4 KG, and the magnitude of its saturated magnetization was 70 emu/cc.

In addition, it can be understood from the B-H curves (FIG. 14) measured by applying a magnetic field vertically at the set angle of 0 that the bias magnetic field obtained by the magnetic combination of the two films acts on the GdFe film at a magnitude of about 500–700 G.

The preferable coercive force of the magnetic bubble-forming magnetic film is 50–200 g or thereabouts, while the preferable coercive force of the magnetic film for imparting a bias magnetic field is 3–10 KG or thereabouts.

ponents starts to increase at a set angle of 20 degrees in the case of a magnetic film having a coercive force of 200 G or thereabouts and at a set angle of 40 degrees in the case of a magnetic film having a coercive force of 10 KG or thereabouts. A preferable set angle is between 40 and 70 degrees.

To allow a bias magnetic field to act effectively, a setting may be provided such that the product of a value of saturated magnetization and film thickness in the case of the magnetic bubble-forming magnetic film becomes substantially equal to the product in the case of the magnetic film for imparting a bias magnetic field.

One example of configuration of this magnetic bubble card will now be described.

A transfer passage pattern was formed on a 1 mm-thick polycarbonate flat plate using a photo-setting epoxy acrylate resin by means of a stamper. The pattern of the transfer passage was a continuous disk pattern in the form of beads having a diameter of about $5\mu$, as shown in FIG. 11B. The thickness of the pattern was about $0.5\mu$, and the angle of the peripheral edge portion of the pattern with respect to the substrate surface was approx. 60 degrees. Then, an $Al_2O_3$ film having a thickness of 1,000 Å was provided as a protective film by means of sputtering. Furthermore, a $Gd_{17}Fe_{80}Co_3$ film having a thickness of 1,000 Å was provided as a magnetic bubble forming magnetic film. The saturated magnetization Ms was 200 emu/cc, the coercive force was 50 G, and a magnetic field applied perpendicularly to the film surfaces so saturate magnetization was 900 G.

Then, a $Dy_{20}Fe_{60}Co_{20}$ film having a 3,000 Å thickness was provided thereon as a magnetic film for producing a bias magnetic field. Its saturated magnetization Ms was 100 emu/cc, and its coercive force was 5 KG.

Subsequently, a polyimide resin film having a $25\mu$ thickness was provided as a protective film.

A magnetic field of 20 KG or more was applied to the samples prepared as described above, and after magnetization of the magnetic films was aligned in the direction perpendicular to the substrate surface, magnetic bubbles were formed using the data input/output system shown in FIGS. 7 and 8. Then, while a rotating magnetic field of 120 G magnitude in the planar direction of the card substrate was being applied at a frequency of 10 Hz, the movement of the magnetic bubbles was observed with a polarizing microscope. As a result, it was possible to observe magnetic bubbles having a diameter of approx. 2μ move along the peripheral edge portion of the transfer passage pattern.

Then, samples of magnetic bubble cards were prepared in the same way as the above-described card except that a substrate was used in which the angle of the peripheral edge portion of the transfer passage pattern with respect to the substrate surface was varied between 10 and approx. 90 degrees. The movement of the magnetic bubbles was observed while the driving magnetic field applied to the respective samples was varied. The results are shown in Table 2. It can be seen from these results that the samples using a substrate in which the angle is set between 20 and 80 degrees are capable of transferring bubbles.

In addition, although the movement of the bubbles was slightly inactive in the case of Samples 1 to 3, this is conceivably attributable to the fact that the magnetization of the magnetic film for imparting a bias magnetic field failed to be reversed sufficiently in the driving magnetic field, and a bias magnetic field remains which tends to orient the magnetization of the magnetic films in one direction even in the peripheral edge portion of the transfer passage pattern.

TABLE 2

| Sample | Set Angle (degrees) | Drivable Applied Magnetic Field (G) | Movement of Bubbles |
|---|---|---|---|
| 1 | 10 | 500 | (Deformation of bubbles is greater than movement of bubbles.) |
| 2 | 20 | 200 | possible |
| 3 | 30 | 100 | possible |
| 4 | 40 | 70 | good |
| 5 | 50 | 50 | good |
| 6 | 60 | 50 | good |
| 7 | 70 | 50 | good |
| 8 | 80 | 100 | possible |
| 9 | 90 | 1,000 or more | (Destruction of bubbles occurs rather than movement of bubbles.) |

As described above, in accordance with this embodiment, a magnetic bubble recording device is provided which is provided with a first magnetic layer for forming a magnetic bubble on a substrate having a pattern of a magnetic bubble transfer passage and a second magnetic layer for imparting a bias magnetic field to the first magnetic layer so as to stably hold the magnetic bubble, wherein the peripheral edge portion of the pattern of the magnetic bubble transfer passage has an inclination of 20 to 80 degrees with respect to the region where the magnetic bubble is formed, so that it is possible to transfer the magnetic bubble efficiently. In addition, fine processing for providing transfer passages and wiring patterns for signal lines on a conventional magnetic bubble chip and the installation of a magnet and a coil for generating biased and driving magnetic fields can be dispensed with, and it is possible to provide a compact storage device at low cost.

Figure 16:
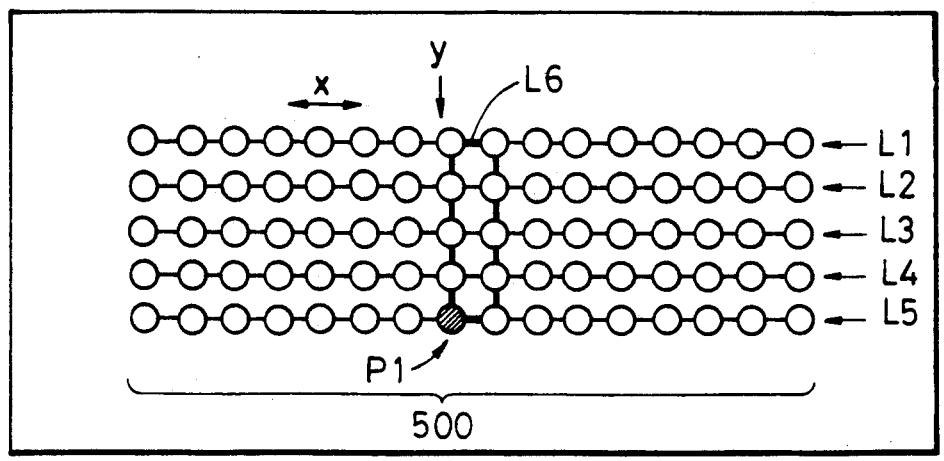
FIG. 16 is an enlarged top plan view illustrating the effect of the pattern of a transfer passage of this magnetic bubble recording device.

FIG. 16 illustrates a preferable form of the pattern of the transfer passage 13 provided in the magnetic bubble card in accordance with the present invention. The basic structure of the magnetic bubble card is similar to that shown in FIGS. 2A, 2B, 3 and 4, and the device shown in FIGS. 25A and 25B or FIG. 26 is used in this embodiment.

In FIG. 16, L1-L5 denote a series of transfer passages (first transfer passages) which do not intersect each other. L6 denotes an example of a processing transfer passage (second transfer passage) for effecting reproduction, recording and erasure of information. The processing transfer passage L6 constitutes a transfer passage in the form of a closed loop (a loop transfer passage in this case) which crosses all the series of adjacent transfer passages L1-L5. Point P1 is provided at one of the points of intersection between the the series of transfer passages L1-L5 and the loop-shaped processing transfer passage L6, and is a location to which a laser beam for recording, reproduction and erasure is applied by the apparatus shown in FIGS. 7 and 8.

In FIG. 16, the series of transfer passages L1-L5 constitute patterns for transferring a magnetic bubble in the direction of x in the drawing (horizontally as viewed in the drawing). Their length is generally 10 to 10 K bytes or thereabouts although it varies depending on the information handled. Although linear transfer passages are shown in the drawing, their configuration is not particularly restricted insofar as a magnetic bubble can be transferred.

Figure 17:
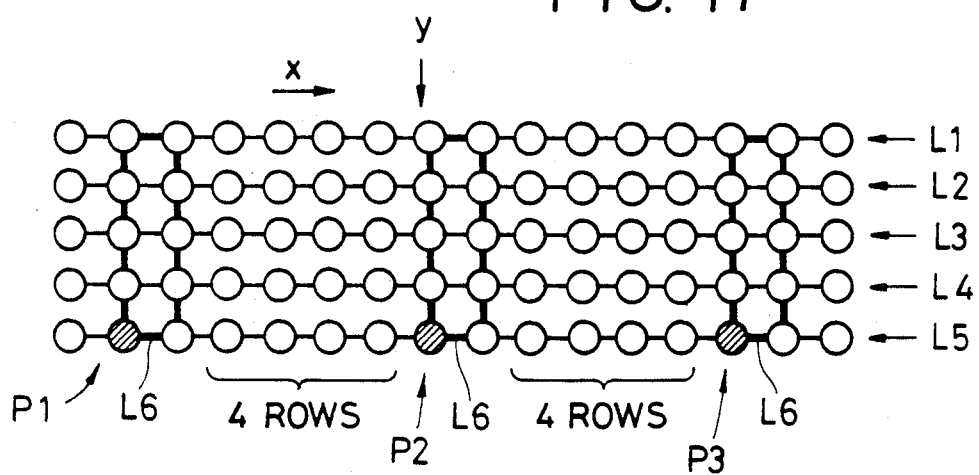
FIG. 17 is an enlarged top plan view illustrating a modification of the pattern of a transfer passage of this magnetic bubble recording device.

In addition, the processing transfer passage L6 is a transfer passage for processing information in contrast to the series of transfer passages L1-L5 which are transfer passages for storing information. Information is fetched to the processing transfer passage L6 for each predetermined unit of information, and the reproduction, recording and erasure of information is effected at the point P1. It should be noted that, although a case is illustrated in the drawing in which only one processing transfer passage L6 is formed among a group 500 of a series of transfer passages, a plurality of processing transfer passages are, in practice, provided depending on the size of the group 500 of the series of transfer passages, the required processing speed, and the like. FIG. 17 illustrates such an example, in which processing passages are provided at intervals of four rows, so that there is the advantage that information can be accessed within a very short period of time. It goes without saying that it is possible to adopt an arrangement in which are provided a plurality of sets of groups 500 of a series of transfer passages and a plurality of processing transfer passages L6 corresponding to the same.

Figure 18:
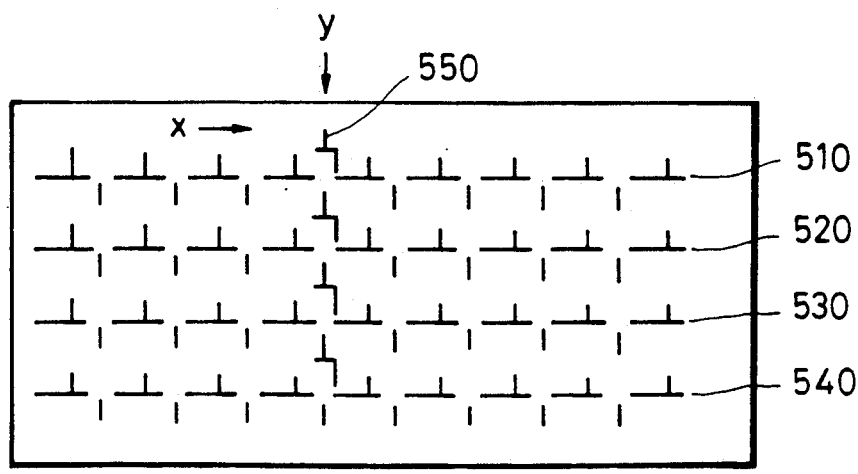
FIG. 18 is an enlarged top plan view illustrating a specific configuration of the pattern of the transfer passage shown in FIG. 16.
Figure 19A:
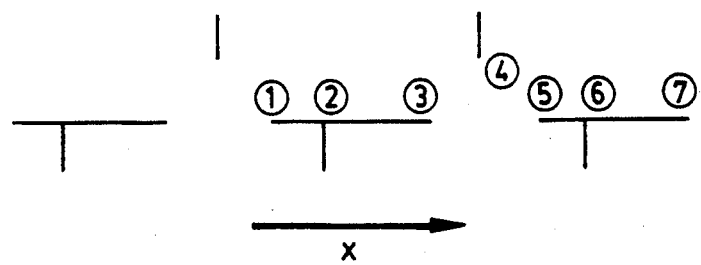
FIGS. 19A, 19B, 20A and 20B are diagrams illustrating a method of transferring a magnetic bubble in the X- and Y-directions along the pattern of the transfer passage shown in FIG. 18.
Figure 19B:
Figure 20A:
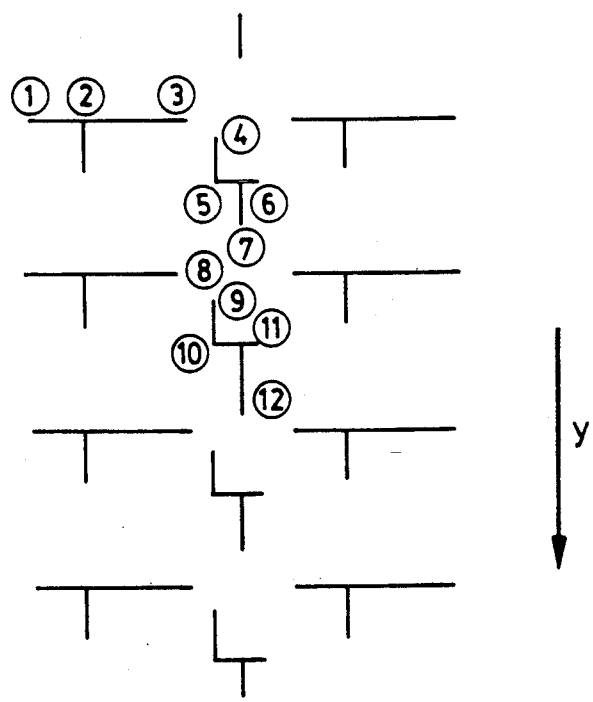
Figure 20B:
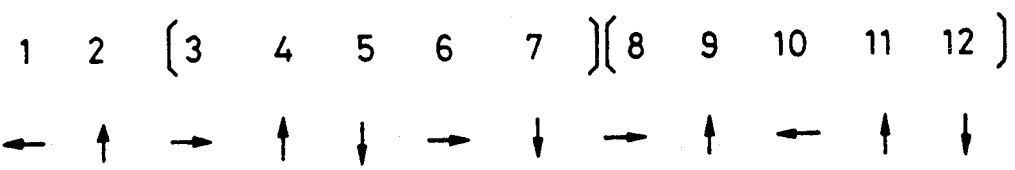

FIG. 18 is a diagram illustrating patterns of the planarly magnetized film formed of permalloy or the like and adapted to move a magnetic bubble in the directions of x and y. In FIG. 18, passages 510-540 respectively correspond to a series of transfer passages for transferring a magnetic bubble in the x-direction, and 550 denotes a part of the processing transfer passage for transferring a magnetic bubble in the y-direction. To transfer a magnetic bubble in the x-direction, in FIG. 19A, a rotating magnetic field parallel with the substrate surface is applied as shown at 1 to 7 in FIG. 19B, which, in turn, causes the permalloy patterns to be magnetized consecutively along the direction of rotation, thereby transferring the magnetic bubble. In addition, in order to transfer a magnetic bubble in the y-direction, in FIG. 20A, a rotating magnetic field parallel with the substrate surface is applied as shown at 1 to 12 in FIG. 20B, thereby transferring the magnetic bubble. Patterns for transferring in both x- and y-directions are not confined to this example, and various types are already disclosed in the literature. Accordingly, it is also possible to use such patterns.

A specific description will now be given of a method of information processing using the series of transfer passages L1–L5 and the processing transfer passage L6 in accordance with the embodiment shown in FIG. 16.

First, the process of "erasure" in accordance with the present invention will be described.

FIGS. 21A to 21F are diagrams illustrating a case in which a part of the transfer passages shown in FIG. 16 is extracted, and an erasing operation is executed in the order of (A) to (F). Here, it is assumed that information a, b, ..., s, t has been recorded in bit strings K1 to K5 in the series of transfer passages L1 to L5, and that an attempt is made to erase "f" in the bit string K5.

Figure 21A:
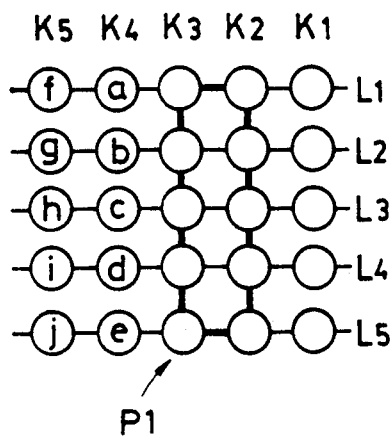
FIGS. 21A to 21F are diagrams illustrating a method of erasing a magnetic bubble in this magnetic bubble recording device.
Figure 21B:
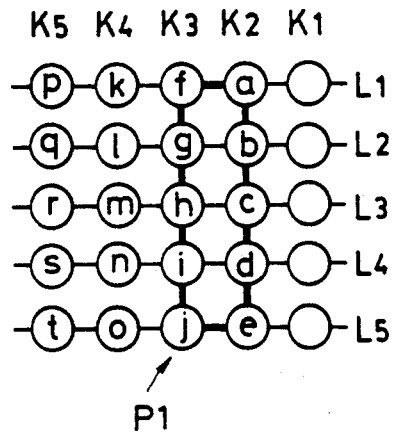

First, the bit strings of the magnetic bubbles are driven rightwardly, as viewed in the drawing, by two rows by imparting a rotating magnetic field in the planar direction of the substrate surface at a fixed angular velocity (from FIG. 21A to FIG. 21B). At this time, the address recorded in L5 with respect to the bit strings being transferred is monitored at the point P1 by the apparatus shown in FIGS. 7 and 8. (In this example, it is assumed that, when data is input to bit strings in a recording process, an address is recorded on the bits of L5 for each bit string. That is, in FIG. 21B, an address is recorded at e, j, o and t.)

Figure 21C:
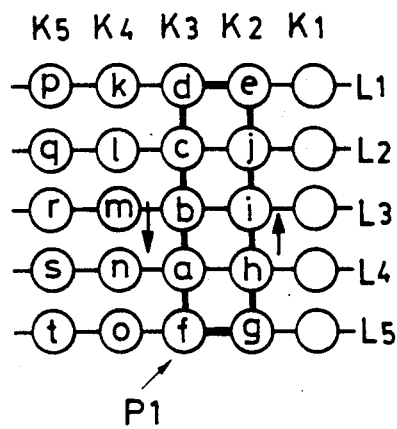

When a bit string of a desired address has arrived, magnetic bubbles are transferred vertically along the processing transfer passage L6 in the form of a loop in which these bit strings are consecutively closed and the magnetic bubble of f is brought to the position of P1 (FIG. 21C). In order to transfer bubbles in the two directions, it is necessary to effect a design of the configuration of the transfer passage patterns and a design of a driving magnetic field corresponding thereto. For instance, Japanese Patent Publication No. 27030/1984 suggests the possibility of driving in the two directions by making use of a method of driving a rotating magnetic field and driving by sharply changing the direction of a driving magnetic field by 180 degrees.

Figure 21D:
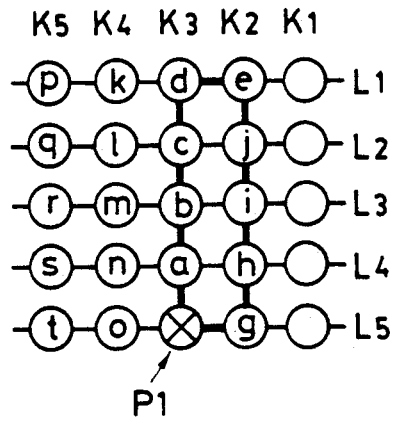
Figure 21E:
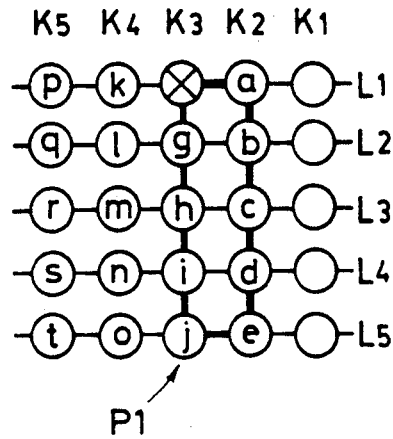
Figure 21F:
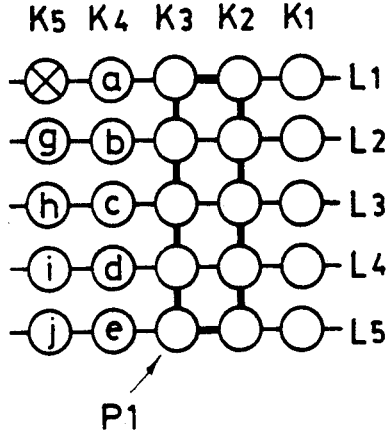

Next, a laser beam is applied to the point P1 by the apparatus shown in FIGS. 7 and 8 to increase the temperature of the magnetic bubble-forming magnetic film, thereby erasing the relevant magnetic bubble of the bit string. In FIG. 21D, the erased bit is shown by X. It is possible to apply a magnetic field for aiding the erasure to the vicinity of the point P1, as required. Then, after the bit string is rotated (moved) along the processing transfer passage by a rotating magnetic field in the planar direction (FIG. 21E), the bit string is moved back to its original position by transferring the bit string leftwardly, as viewed in the drawing, along the series of transfer passages (FIG. 21F). This completes the "erasing" process.

Next, a description of the "recording" process in accordance with the present invention will be given. Although the basic principle of the "recording" process is the same as that of the "erasing" process, the difference lies in that, in the case of recording, information on the position of corresponding data is irradiated with a beam modulated by the input signal of data to increase the temperature of the magnetic bubble-forming film, thereby forming a bit string of magnetic bubbles corresponding to the data signal.

In other words, in recording, the bit string of magnetic bubbles is first driven horizontally along the transfer patterns L1–L5 shown in FIG. 21. At this time, the address recorded in advance in L5 among the bit strings being transferred is monitored by the apparatus shown in FIGS. 7 and 8. When a bit string of a desired address has arrived, this bit string is transferred vertically along the processing transfer passage L6 in the form of a closed loop. Then, the point P1 is irradiated with a beam modulated by an input signal representing the data, by the apparatus shown in FIG. 7 and 8 to increase the temperature of the magnetic bubble-forming magnetic film, thereby recording a bit string of magnetic bubbles corresponding to the data signal. A magnetic field for aiding the recording may be applied to the vicinity of the pint P1, as required. This completes the recording.

Finally, a "reproducing" process in accordance with the present invention will be described.

First, bit strings of magnetic bubbles are transferred horizontally along the transfer passages L1–L5 shown in FIG. 21. At this time, the address recorded in advance in L5 among the bit strings being transferred is monitored by the apparatus shown in FIGS. 7 and 8. When a bit string of a desired address has arrived, this bit string is transferred vertically along the processing transfer passage L6 in the form of a consecutively closed loop. Then, a beam reflected from the bit string is monitored at the point P1 by the sensor by the apparatus shown in FIGS. 7 and 8, thereby obtaining a reproduction signal.

The photomagnetic effect is utilized in the detection of the presence o absence of a magnetic bubble. In other words, as regards the laser beam reflected by the magnetic bubble detection area P1, the direction of rotation of a polarizing surface differs depending on the orientation of the magnetization of the magnetic bubble, so that the installation angle of the photodetector 35 is set appropriately to discriminate between the presence or absence of the magnetic bubble by making use of the phenomenon in which the amount of laser beam made incident upon the photosensor 36 varies depending on the presence or absence of the magnetic bubble. The apparatus and arrangement which makes use of this phenomenon is generally employed in the recording and reproduction using a photomagnetic disk.

Figure 22A:
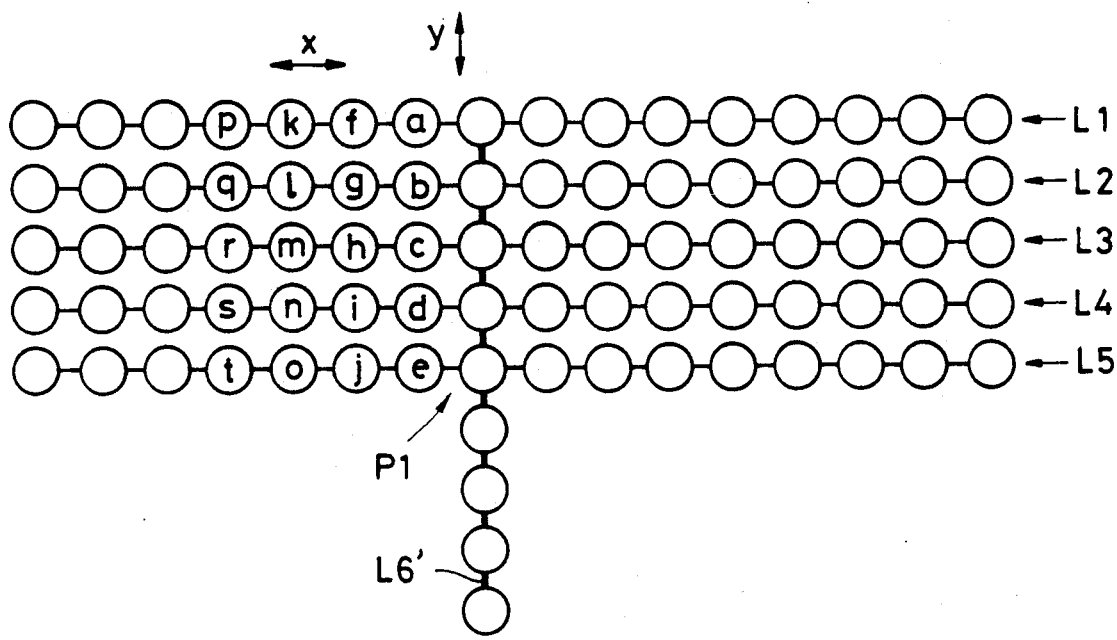
FIGS. 22A and 22B are enlarged top plan views illustrating another modification of the pattern of the transfer in FIG. 16.
Figure 22B:
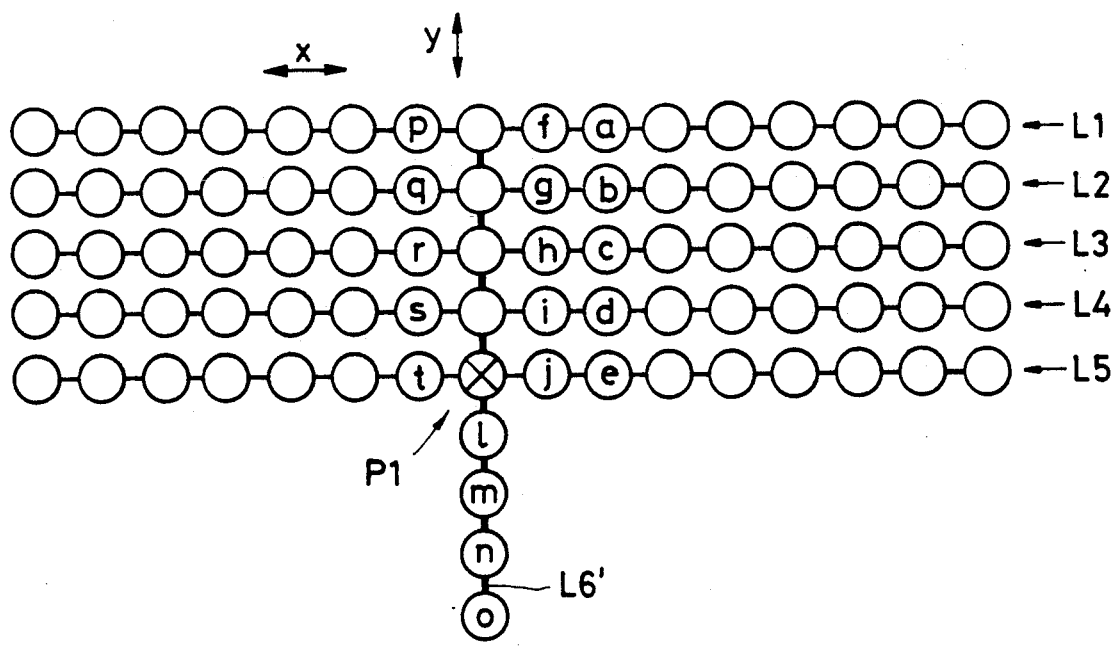

FIGS. 22A and 22B are diagrams illustrating a case in which the the processing transfer passage is not in the form of a loop but a linear transfer passage L6'. In this embodiment, when a certain bit string is to be processed, as shown in FIGS. 22A and 22B, that bit string is drawn into the linear bit transfer passage L6', and a recording, erasing or reproducing operation is carried out at the point P1. Upon completion of that processing, the bit string is returned to its original position. In this embodiment, a magnetic field applied vertically (in the y-direction) must be varied at the time of drawing in a bit string and at the time of returning the same. However, there is an advantage in that the configuration of the transfer passages is simpler than that shown in FIG. 16.

To produce a magnetic bubble card in accordance with the present invention, a substrate is first prepared which has a pattern of the above-described series of transfer passages and the above-described transfer passage as the transfer passages for magnetic bubbles. Then, a magnetic film for forming magnetic bubbles and a magnetic film for imparting a bias magnetic field for stably holding the magnetic bubbles adjacent thereto are provided on the substrate having the above-described pattern, thereby producing a magnetic bubble card in accordance with the present invention. A card thus produced is used in combination with an apparatus such as the one shown in FIGS. 7 and 8 which is capable of effecting the writing, reading and erasing of data through non-contact with the card surface.

An example of the configuration of this magnetic bubble card will be illustrated hereafter.

Figure 23:
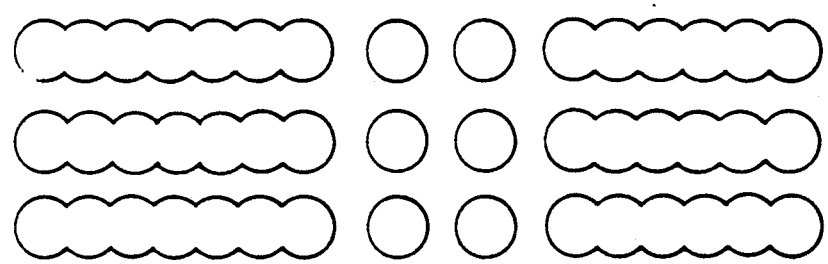
FIG. 23 is an enlarged top plan view illustrating still another modification of the pattern of the transfer passage shown in FIG. 16.

As a magnetic bubble-forming magnetic layer, a $Gd_{20}Fe_{80}$ (atomic ratio) film having a 9,000 Å thickness was provided, by sputtering, on a 1-mm polycarbonate substrate having a continuous disk pattern (corresponding to L1-L5 in FIG. 16) with a diameter of about $5\mu$ and a thickness of about $2\mu$ and an isolated disk pattern (corresponding to L6 in FIG. 16) with a diameter of about $5\mu$ and a thickness of about $2\mu$, as shown in FIG. 23. Then, as a magnetic film for generating a bias magnetic field, a $Tb_{10}Gd_{10}Fe_{65}Co_{15}$ (atomic ratio) having a 5,000 Å thickness was provided thereon by sputtering. In addition, a photo-setting acrylic resin having a thickness of $20\mu$ was provided as a protective layer.

When a rotating magnetic field of 350 G at 50 Hz was applied t the thus-prepared magnetic bubble card in the planar direction of the substrate surface, it was verified that magnetic bubbles were transferred along the continuous pattern shown in FIG. 23.

Figure 24:
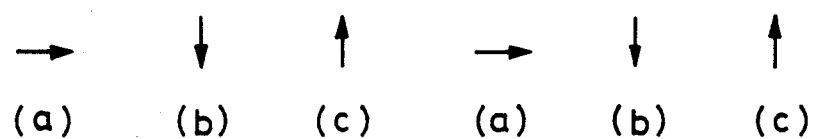
FIG. 24 is a diagram illustrating a state in which an interplanar magnetic field is applied when a magnetic bubble is transferred along the pattern of the transfer passage shown in FIG. 23 and FIGS. 25A, 25B, and 26 are diagrams illustrating a still further embodiment of a magnetic bubble recording device in accordance with the present invention.

Then, when a magnetic field which has the magnitude of 350 G and whose direction changes in the order shown in FIG. 24 was applied in the direction of the substrate surface, it was verified that magnetic bubbles were transferred vertically along the disk pattern shown in FIG. 23 (downwardly as viewed in the drawing).

In FIG. 24, (a) shows the direction of a driving magnetic field during an initial period. The magnetic field changes by rotating slowing clockwise from (a) to (b). The direction of the magnetic field changes instantly from (b) to (c). At this juncture, the magnetic bubble shifts downwardly by one line. Then, the magnetic field changes clockwise slowly from (c) to (a). Subsequently, this pattern (sequence) of application of the magnetic field is repeated to shift the bit string downwardly.

Then, the recording and erasing of magnetic bubbles was verified using semiconductor laser beams condensed into a diameter of about $5\mu$ by means of the apparatus shown in FIGS. 7 and 8. As for the required laser power, about 10 mW sufficed under the condition of irradiation for 1 msec by applying an auxiliary magnetic field of 20 gauss or thereabouts.

As described above, in accordance with this magnetic bubble recording device and a method of transferring magnetic bubbles using said device, complicated fine processing for providing wiring patterns for various signal lines on the recording medium itself is unnecessary, so that there is an advantage in that the device itself can be produced at low cost. In addition, there is another advantage in that the processing of information can be effected by merely controlling an external magnetic field with no need to provide wiring patterns for various signal lines for information processing.

In addition, in accordance with the transfer method, recording method, erasing method and reproducing method and the information recording and reproducing apparatus in accordance with the present invention, there is the advantage that the recording, erasure and reproduction of information can be conducted efficiently using the above-described magnetic bubble recording device through a combination of the control of an external magnetic field and an optical method.

In other words, the transfer method in accordance with the present invention is characterized by: using a magnetic bubble recording device wherein a magnetic film for forming a magnetic bubble and a magnetic film for imparting a bias magnetic field for stably holding the magnetic bubble are provided on a substrate on which is formed a predetermined pattern of a magnetic bubble transfer passage, and wherein the bubble transfer passage includes a series of transfer passages that do not intersect each other and a processing transfer passage that crosses all the series of transfer passages; and effecting transfer of the magnetic bubble in the magnetic bubble recording device in the directions of the series of transfer passages and the processing transfer passage by controlling an unlocalized magnetic field applied from the outside.

In addition, the information recording and reproducing apparatus employed in the present invention is characterized by using a magnetic bubble recording device wherein a magnetic film for forming a magnetic bubble and a magnetic film for imparting a bias magnetic field for stably holding the magnetic bubble are provided on a substrate on which is formed a predetermined pattern of a magnetic bubble transfer passage, and wherein the bubble transfer passage includes a series of transfer passages that do not intersect each other and a processing transfer passage that crosses all the series of transfer passages, the information recording and reproducing apparatus comprising: driving magnetic field generating means for transferring the magnetic bubble along both patterns of the series of transfer passages and the processing transfer passage; means for applying a polarizing beam to a portion of intersection between the series of transfer passages and the processing transfer passage; and sensor means for monitoring the intensity of the reflected beam applied by the polarizing beam applying means, thereby effecting reproduction, recording, and/or erasure of data.

Furthermore, the data erasing method in accordance with the present invention is characterized by using a magnetic bubble recording device wherein a magnetic film for forming a magnetic bubble and a magnetic film for imparting a bias magnetic field for stably holding the magnetic bubble are provided on a substrate on which is formed a predetermined pattern of a magnetic bubble transfer passage, and wherein the bubble transfer passage includes a series of transfer passages that do not intersect each other and a processing transfer passage that crosses all the series of transfer passages, and effects the erasure of data by the following processes (1) to (4):

(1) a bit string of magnetic bubbles is transferred by a driving magnetic field along the pattern of the series of transfer passages;

(2) an address recorded in a portion of the bit string being transferred is monitored by a beam-applying and monitoring apparatus;

(3) when a bit string of a desired address has arrived, the bit string is transferred consecutively along the pattern of the processing transfer passage; and (4) by application of a beam by the beam-applying and monitoring apparatus, the temperature of the magnetic bubble-forming magnetic film is increased to erase the bit string of magnetic bubbles.

The recording method in accordance with the present invention is characterized by using a magnetic bubble recording device wherein a magnetic film for forming a magnetic bubble and a magnetic film for imparting a bias magnetic field for stably holding the magnetic bubble are provided on a substrate on which is formed a predetermined pattern of a magnetic bubble transfer passage, and wherein the bubble transfer passage includes a series of transfer passages that do not intersect each other and a processing transfer passage that crosses all the series of transfer passages, and effects the recording of data by the following processes (1) to (4):

(1) a bit string of magnetic bubbles is transferred by a driving magnetic field along the pattern of the series of transfer passages;

(2) an address recorded in a portion of the bit string being transferred is monitored by a beam-applying and monitoring apparatus;

(3) when a bit string of a desired address has arrived, the bit string is transferred consecutively along the pattern of the processing transfer passage; and (4) a beam modulated by the input signal of data is applied by the beam-applying and monitoring apparatus to increase the temperature of the magnetic bubble-forming magnetic film, thereby recording a desired bit string of magnetic bubbles.

The reproducing method in accordance with the present invention is characterized by using a magnetic bubble recording device wherein a magnetic film for forming a magnetic bubble and a magnetic film for imparting a bias magnetic field for stably holding the magnetic bubble are provided on a substrate on which is formed a predetermined pattern of a magnetic bubble transfer passage, and wherein the bubble transfer passage includes a series of transfer passages that do not intersect each other and a processing transfer passage that crosses all the series of transfer passages, and effects the reproduction of data by the following processes (1) to (4):

(1) a bit string of magnetic bubbles is transferred by a driving magnetic field along the pattern of the series of transfer passages;

(2) an address recorded in a portion of the bit string being transferred is monitored by a beam-applying and monitoring apparatus;

(3) when a bit string of a desired address has arrived, the bit string is transferred consecutively along the pattern of the processing transfer passage; and (4) a beam reflected from the bit string is monitored by the beam-applying and monitoring apparatus so as to obtain a reproduction signal.

Since the above-described features are provided, it is possible to obtain the above-described outstanding advantages.

While the invention has been particularly shown and described with reference to preferred embodiments thereof, it will be understood by those skilled in the art that the foregoing and other changes in form and details can be made therein without departing form the spirit and scope of the invention.

What is claimed is:

1. A magnetic bubble recording element comprising:
a substrate having a transfer channel;
a first magnetic layer for carrying a magnetic bubble therein, said first magnetic layer being formed on said substrate within and outside of said transfer channel with a surface of said first magnetic layer within said transfer channel being offset from at least a portion of a surface of said first magnetic layer outside of said transfer channel;
a second magnetic layer for applying a bias magnetic field to said first magnetic layer, said second magnetic layer being formed on said first magnetic layer within and outside of said transfer channel;
a protective layer for protecting said first and second magnetic layers, said protective layer being formed so as to cover said first and said second magnetic layers; and
an alignment pattern, said alignment pattern being formed on a predetermined portion of said protective layer, and having a reflecting rate which differs from that of the other portions of said protective layer.

2. A magnetic bubble recording element comprising:
a substrate having a transfer channel;
a first magnetic layer for carrying a magnetic bubble therein, said first magnetic layer being formed on said substrate within and outside of said transfer channel with a surface of said first magnetic layer within said transfer channel being offset from at least a portion of a surface of said first magnetic layer outside of said transfer channel;
a second magnetic layer for applying a bias magnetic field to said first magnetic layer, said second magnetic layer being formed on said first magnetic layer within and outside of said transfer channel; and
an alignment pattern, said alignment pattern being formed on a predetermined portion of said substrate which is remote from a side where said first and second magnetic layers are formed, and said pattern shows a reflecting rate which differs from that of the other portions of said substrate.

3. A magnetic bubble recording element comprising:
a substrate having a transfer channel, and a peripheral edge portion of said transfer channel having a surface inclined with respect to a surface of said substrate;
a first magnetic layer for carrying a magnetic bubble therein, said first magnetic layer being formed on said substrate within and outside of said transfer channel with a surface of said first magnetic layer within said transfer channel being offset from at least a portion of a surface of said first magnetic layer outside of said transfer channel; and
a second magnetic layer for applying a bias magnetic field to said first magnetic layer, said second magnetic layer being formed on said first magnetic layer within and outside of said transfer channel.

4. An element according to claim 3, wherein said inclined surface is inclined by 20° to 80° with respect to the surface of said substrate.

5. An element according to claim 4, further comprising a protective layer for protecting said first and second magnetic layers, said protective layer being formed so as to cover said first and second magnetic layers.

6. A magnetic bubble recording element comprising:
a substrate having a transfer channel, said transfer channel including a first pattern comprising a plurality of x-direction transfer channels that do not intersect each other and a second pattern including a y-direction transfer channel that intersects said plurality of x-direction transfer channels;
a first magnetic layer for carrying a magnetic bubble therein, said first magnetic layer being formed on said substrate within and outside of said transfer channel with a surface of said first magnetic layer within said transfer channel being offset from at least a portion of a surface of said first magnetic layer outside of said transfer channel; and
a second magnetic layer for applying a bias magnetic field to said first magnetic layer, said second magnetic layer being formed on said first magnetic layer within and outside of said transfer channel.

7. An element according to claim 6, wherein said second pattern comprises a plurality of y-direction transfer channels.

8. An element according to claim 7, wherein each of said x-direction transfer channels of said first pattern and each of said y-direction transfer channels of said second pattern intersect at right angles.

9. An element according to claim 8, further comprising a protective layer for protecting said first and second magnetic layers, said protective layer being formed so as to cover said first and second magnetic layers.

10. A magnetic bubble recording element comprising:
a substrate having a transfer channel;
a first magnetic layer for carrying a magnetic bubble therein, said first magnetic layer being formed on said substrate within and outside of said transfer channel with a surface of said first magnetic layer within said transfer channel being offset from at least a portion of a surface of said first magnetic layer outside of said transfer channel;
a second magnetic layer for applying a bias magnetic field to said first magnetic layer, said second magnetic layer being formed between said substrate and said first magnetic layer within and outside of said transfer channel;
a protective layer for protecting said first and second magnetic layers, said protective layer being formed so as to cover said first and said second magnetic layers: and
an alignment pattern, said alignment pattern being formed on a predetermined portion of said protective layer, and having a reflecting rate which differs from that of the other portions of said protective layer.

11. A magnetic bubble recording element comprising:
a substrate having a transfer channel;
a first magnetic layer for carrying a magnetic bubble therein, said first magnetic layer being formed on said substrate within and outside of said transfer channel with a surface of said first magnetic layer within said transfer channel being offset from at least a portion of a surface of said first magnetic layer outside of said transfer channel;
a second magnetic layer for applying a bias magnetic field to said first magnetic layer, said second magnetic layer being formed between said substrate and said first magnetic layer within and outside of said transfer channel; and
an alignment pattern, said alignment pattern being formed on a predetermined portion of said substrate which is remote form a side where said first and second magnetic layers are formed, and said pattern shows a reflecting rate which differs from that of the other portions of said substrate.

12. A magnetic bubble recording element comprising:
a substrate having a transfer channel;
a first magnetic layer for carrying a magnetic bubble therein, said first magnetic layer being formed on said substrate within and outside of said transfer channel with a surface of said first magnetic layer within said transfer channel being offset from at least a portion of a surface of said first magnetic layer outside of said transfer channel;
a second magnetic layer for applying a bias magnetic field to said first magnetic layer, said second magnetic layer being formed on said first magnetic layer within and outside of said transfer channel; and
an alignment pattern, said alignment pattern being formed on a predetermined portion of said second magnetic layer, and having a reflecting rate which differs from that of the other portions of said second magnetic layer.

13. a magnetic bubble recording element comprising:
a substrate having a transfer channel;
a first magnetic layer for carrying a magnetic bubble therein, said first magnetic layer being formed on said substrate within and outside of said transfer channel with a surface of said first magnetic layer within said transfer channel being offset from at least a portion of a surface of said first magnetic layer outside of said transfer channel;
a second magnetic layer for applying a bias magnetic field to said first magnetic layer, said second magnetic layer being formed between said substrate and said first magnetic layer within and outside of said transfer channel; and
an alignment pattern, said alignment pattern being formed on a predetermined portion of said first magnetic layer, and having a reflecting rate which differs from that of the other portions of said first magnetic layer.

14. A magnetic bubble recording element comprising:
a substrate having a transfer channel, and a peripheral edge portion of said transfer channel having a surface inclined with respect to a surface of said substrate;
a first magnetic layer for carrying a magnetic bubble therein, said first magnetic layer being formed on said substrate within and outside of said transfer channel with a surface of said first magnetic layer within said transfer channel being offset from at least a portion of a surface of said first magnetic layer outside of said transfer channel; and
a second magnetic layer for applying a bias magnetic field to said first magnetic layer, said second magnetic layer being formed between said substrate and said first magnetic layer within and outside of said transfer channel.

15. An element according to claim 14, wherein said inclined surface is inclined to 20° to 80° with respect to the surface of said substrate.

16. An element according to claim 15, further comprising a protective layer for protecting said first and second magnetic layers, said protective layer being formed so as to cover said first and second magnetic layers.

17. A magnetic bubble recording element comprising:
a substrate having a transfer channel, said transfer channel including a first pattern comprising a plurality of x-direction transfer channels that do not intersect each other and a second pattern including a y-direction transfer channel that intersects said plurality of x-direction transfer channels;
a first magnetic layer for carrying a magnetic bubble therein, said first magnetic layer being formed on said substrate within and outside of said transfer channel with a surface of said first magnetic layer within said transfer channel being offset from at least a portion of a surface of said first magnetic layer outside of said transfer channel; and
a second magnetic layer for applying a bias magnetic field to said first magnetic layer, said second magnetic layer being formed between said substrate and said first magnetic layer within and outside of said transfer channel.

18. An element according to claim 17, wherein said second pattern comprises a plurality of y-direction transfer channels.

19. An element according to claim 18, wherein each of said x-direction transfer channels of said first pattern and each of said y-direction transfer channels of said second pattern intersect at right angles.

20. An element according to claim 19, further comprising a protective layer for protecting said first and second magnetic layers, said protective layer being formed so as to cover said first and second magnetic layers.

* * * * *

UNITED STATES PATENT AND TRADEMARK OFFICE
CERTIFICATE OF CORRECTION

PATENT NO. : 5,142,491

DATED : August 25, 1992

INVENTOR(S) : YOICHI OSATO

It is certified that error appears in the above-identified patent and that said Letters Patent is hereby corrected as shown below:

Title Page:

AT [57] ABSTRACT

Line 10, "transfer pattern" should read --transfer channel--.

Line 11, "transfer pattern," should read --transfer channel,--.

COLUMN 3

Line 14, "ar" should read --are--.

COLUMN 5

Line 32, "bubbles" should read --bubbles,--.

COLUMN 6

Line 20, "I" should read --It--.

COLUMN 14

Line 5, "flu" should read --flux--.

COLUMN 16

Line 23, "starts" should read --start--.

COLUMN 19

Line 29, "closed" should read --closed,--.

UNITED STATES PATENT AND TRADEMARK OFFICE
CERTIFICATE OF CORRECTION

PATENT NO. : 5,142,491
DATED      : August 25, 1992
INVENTOR(S): YOICHI OSATO

It is certified that error appears in the above-identified patent and that said Letters Patent is hereby corrected as shown below:

COLUMN 20

Line 28, "o" should read --or--.

COLUMN 21

Line 20, "t" should read --to--.

Signed and Sealed this

First Day of February, 1994

Attest:

BRUCE LEHMAN

*Attesting Officer*     *Commissioner of Patents and Trademarks*